(12) United States Patent
Sasaki et al.

(10) Patent No.: US 8,421,243 B2
(45) Date of Patent: Apr. 16, 2013

(54) LAYERED CHIP PACKAGE AND METHOD OF MANUFACTURING SAME

(75) Inventors: Yoshitaka Sasaki, Milpitas, CA (US); Hiroyuki Ito, Milpitas, CA (US); Hiroshi Ikejima, Hong Kong (CN); Atsushi Iijima, Hong Kong (CN)

(73) Assignees: Headway Technologies, Inc., Milpitas, CA (US); SAE Magnetics (H.K.) Ltd., Hong Kong (CN)

( * ) Notice: Subject to any disclaimer, the term of this patent is extended or adjusted under 35 U.S.C. 154(b) by 408 days.

(21) Appl. No.: 12/822,601

(22) Filed: Jun. 24, 2010

(65) Prior Publication Data

US 2011/0316141 A1    Dec. 29, 2011

(51) Int. Cl.
*H01L 23/52* (2006.01)

(52) U.S. Cl.
USPC .......... 257/777; 257/686; 257/E23.142; 438/107; 438/109

(58) Field of Classification Search .......... 257/686, 257/777, E23.142; 438/107, 109, 455
See application file for complete search history.

(56) References Cited

U.S. PATENT DOCUMENTS

| | | | |
|---|---|---|---|
| 5,571,754 | A | 11/1996 | Bertin et al. |
| 5,953,588 | A | 9/1999 | Camien et al. |
| 7,127,807 | B2 | 10/2006 | Yamaguchi et al. |
| 7,557,439 | B1 | 7/2009 | Sasaki et al. |
| 7,652,362 | B2 | 1/2010 | Jung et al. |
| 7,902,677 | B1 | 3/2011 | Sasaki et al. |
| 7,968,374 | B2 | 6/2011 | Sasaki et al. |
| 8,344,494 | B2 * | 1/2013 | Sasaki et al. ........... 257/686 |
| 2002/0096760 | A1 | 7/2002 | Simelgor et al. |
| 2006/0001142 | A1 | 1/2006 | Jeung et al. |
| 2007/0165461 | A1 | 7/2007 | Cornwell et al. |
| 2009/0020889 | A1 | 1/2009 | Murayama et al. |
| 2009/0045525 | A1 | 2/2009 | Matsushima et al. |
| 2009/0085224 | A1 | 4/2009 | Choi et al. |
| 2009/0321957 | A1 | 12/2009 | Sasaki et al. |
| 2010/0140801 | A1 | 6/2010 | Anbai et al. |
| 2010/0200959 | A1 | 8/2010 | Sasaki et al. |
| 2010/0200998 | A1 | 8/2010 | Furuta et al. |
| 2010/0207278 | A1 | 8/2010 | Kwon et al. |
| 2012/0013024 | A1 | 1/2012 | Sasaki et al. |
| 2012/0013025 | A1 | 1/2012 | Sasaki et al. |

OTHER PUBLICATIONS

Jan. 5, 2011 Notice of Allowance issued in copending U.S. Appl. No. 12/588,808.
Apr. 4, 2012 Notice of Allowance issued in U.S. Appl. No. 12/835,291.
Apr. 3, 2012 Notice of Allowance issued in U.S. Appl. No. 12/835,343.
Gann, "Neo-Stacking Technology," *HDI Magazine*, Dec. 1999, Miller Freeman, Inc.
Sasaki et al., U.S. Appl. No. 12/588,808, filed Oct. 28, 2009.

* cited by examiner

*Primary Examiner* — Jack Chen
(74) *Attorney, Agent, or Firm* — Oliff & Berridge, PLC

(57) ABSTRACT

A layered chip package includes a main body, and wiring disposed on a side surface of the main body. The main body includes: a main part including a plurality of layer portions stacked; a plurality of first terminals disposed on the top surface of the main part and connected to the wiring; and a plurality of second terminals disposed on the bottom surface of the main part and connected to the wiring. The plurality of layer portions include a first-type layer portion and a second-type layer portion. The first-type layer portion includes a conforming semiconductor chip, and a plurality of first-type electrodes that are connected to the semiconductor chip and the wiring. The second-type layer portion includes a defective semiconductor chip, and a plurality of second-type electrodes that are connected to the wiring and not to the semiconductor chip.

16 Claims, 31 Drawing Sheets

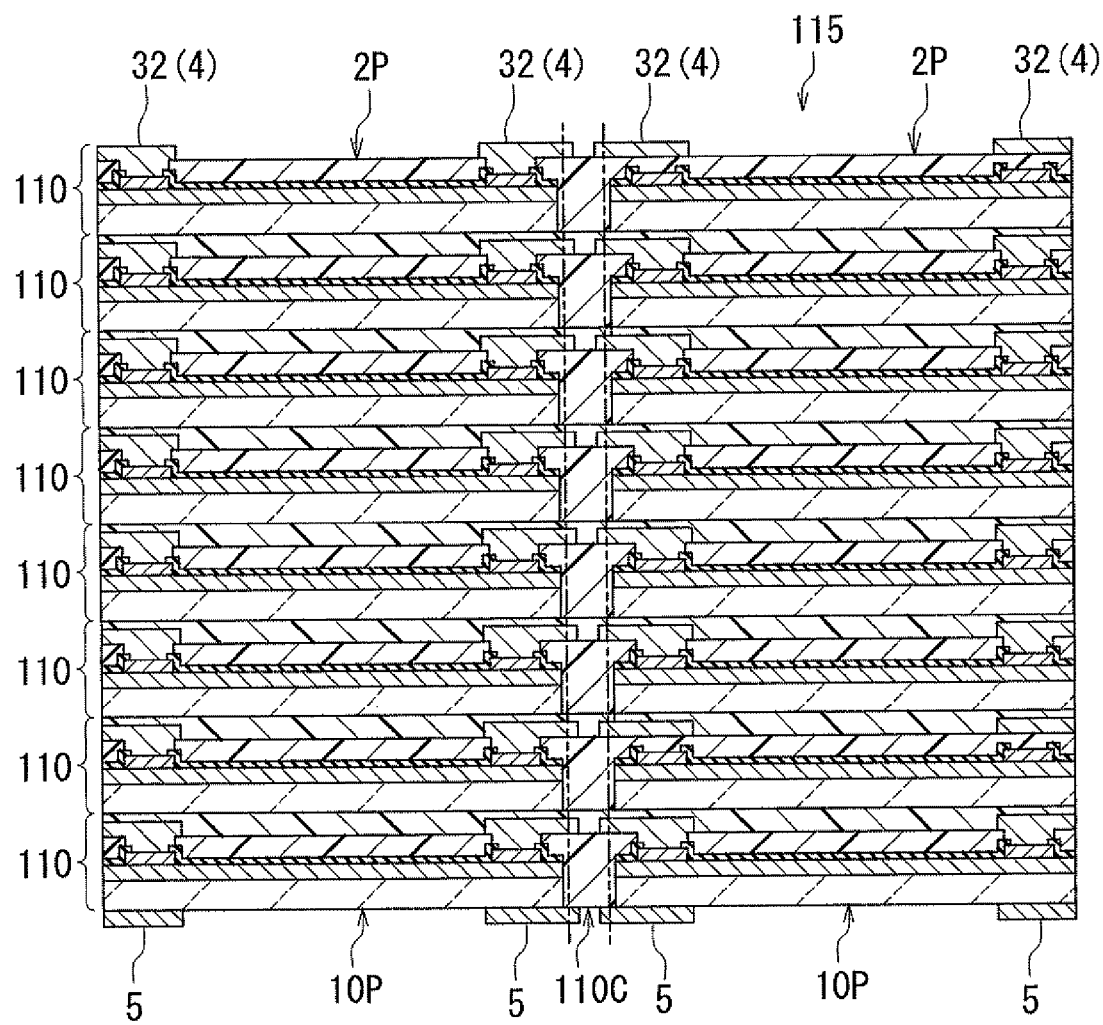
F I G. 22

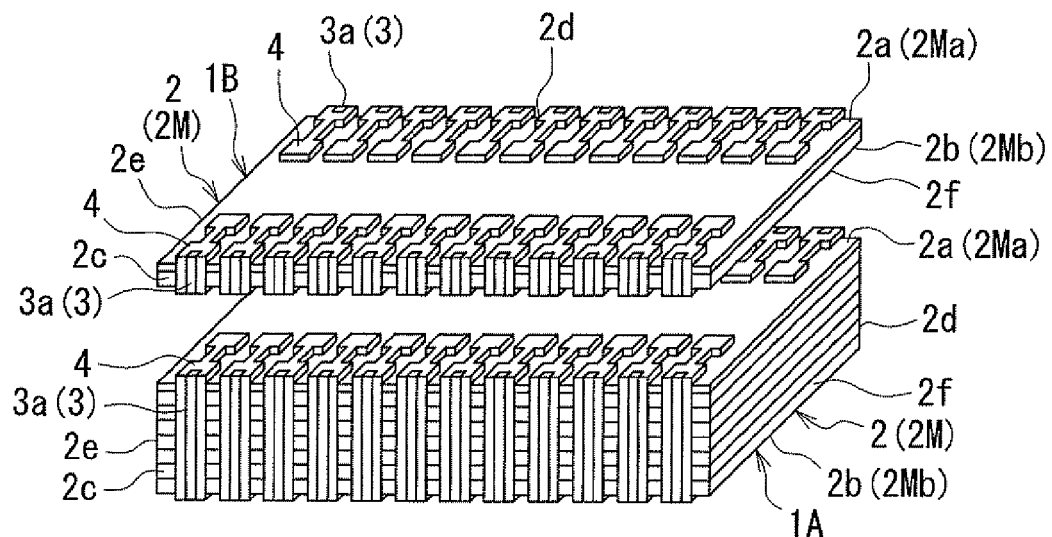
F I G. 45
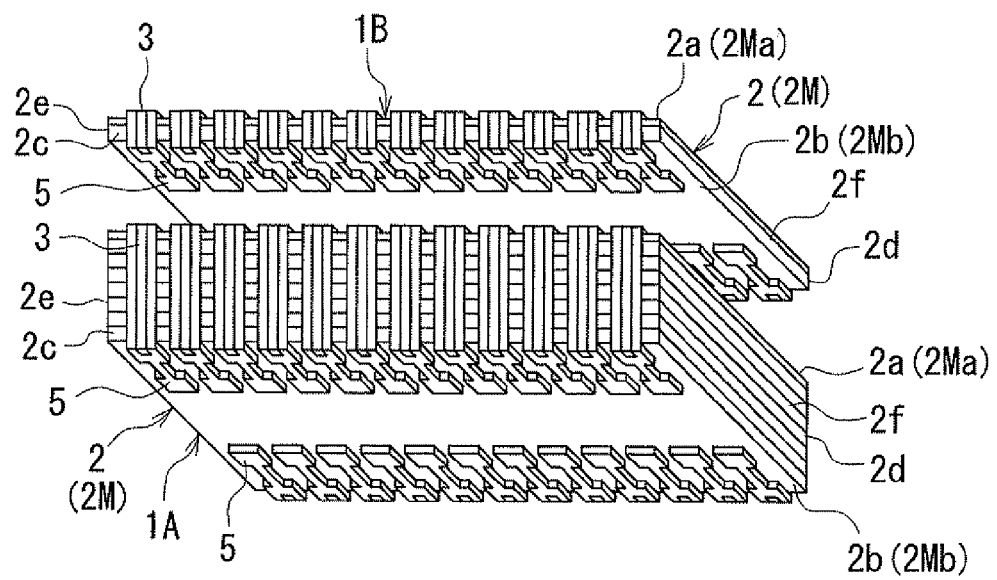
F I G. 46

LAYERED CHIP PACKAGE AND METHOD OF MANUFACTURING SAME

BACKGROUND OF THE INVENTION

1. Field of the Invention

The present invention relates to a layered chip package that includes a plurality of semiconductor chips stacked, and to a method of manufacturing the same.

2. Description of the Related Art

In recent years, lighter weight and higher performance have been demanded of portable devices typified by cellular phones and notebook personal computers. Accordingly, there has been a need for higher integration of electronic components for use in the portable devices. With the development of image- and video-related equipment such as digital cameras and video recorders, semiconductor memories of larger capacity and higher integration have also been demanded.

As an example of highly integrated electronic components, a system-in-package (hereinafter referred to as SiP), especially an SiP utilizing a three-dimensional packaging technology for stacking a plurality of semiconductor chips, has attracting attention in recent years. In the present application, a package that includes a plurality of semiconductor chips (hereinafter, also simply referred to as chips) stacked is called a layered chip package. Since the layered chip package allows a reduction in wiring length, it provides the advantage of allowing quick circuit operation and a reduced stray capacitance of the wiring, as well as the advantage of allowing higher integration.

Major examples of the three-dimensional packaging technology for fabricating a layered chip package include a wire bonding method and a through electrode method. The wire bonding method stacks a plurality of chips on a substrate and connects a plurality of electrodes formed on each chip to external connecting terminals formed on the substrate by wire bonding. The through electrode method forms a plurality of through electrodes in each of chips to be stacked and wires the chips together by using the through electrodes.

The wire bonding method has the problem that it is difficult to reduce the distance between the electrodes so as to avoid contact between the wires, and the problem that the high resistances of the wires hamper quick circuit operation.

The through electrode method is free from the above-mentioned problems of the wire bonding method. Unfortunately, however, the through electrode method requires a large number of steps for forming the through electrodes in chips, and consequently increases the cost for the layered chip package. According to the through electrode method, forming the through electrodes in chips requires a series of steps as follows: forming a plurality of holes for the plurality of through electrodes in a wafer that is to be cut later into a plurality of chips; forming an insulating layer and a seed layer in the plurality of holes and on the top surface of the wafer; filling the plurality of holes with metal such as Cu by plating to form the through electrodes; and removing unwanted portions of the seed layer.

According to the through electrode method, the through electrodes are formed by filling metal into holes having relatively high aspect ratios. Consequently, voids or keyholes are prone to occur in the through electrodes due to poor filling of the holes with metal. This tends to reduce the reliability of wiring formed by the through electrodes.

According to the through electrode method, vertically adjacent chips are physically joined to each other by connecting the through electrodes of the upper chip and those of the lower chip by soldering, for example. The through electrode method therefore requires that the upper and lower chips be accurately aligned and then joined to each other at high temperatures. When the upper and lower chips are joined to each other at high temperatures, however, misalignment between the upper and lower chips can occur due to expansion and contraction of the chips, which often results in electrical connection failure between the upper and lower chips.

U.S. Pat. No. 5,953,588 discloses a method of manufacturing a layered chip package as described below. In the method, a plurality of chips cut out from a processed wafer are embedded into an embedding resin and then a plurality of leads are formed to be connected to each chip, whereby a structure called a neo-wafer is fabricated. Next, the neo-wafer is diced into a plurality of structures each called a neo-chip. Each neo-chip includes one or more chips, resin surrounding the chip(s), and a plurality of leads. The plurality of leads connected to each chip have their respective end faces exposed in a side surface of the neo-chip. Next, a plurality of types of neo-chips are laminated into a stack. In the stack, the respective end faces of the plurality of leads connected to the chips of each layer are exposed in the same side surface of the stack.

Keith D. Gann, "Neo-Stacking Technology", HDI Magazine, December 1999, discloses fabricating a stack by the same method as that disclosed in U.S. Pat. No. 5,953,588, and forming wiring on two side surfaces of the stack.

The manufacturing method disclosed in U.S. Pat. No. 5,953,588 requires a large number of steps and this raises the cost for the layered chip package. According to the method, after a plurality of chips cut out from a processed wafer are embedded into the embedding resin, a plurality of leads are formed to be connected to each chip to thereby fabricate the neo-wafer, as described above. Accurate alignment between the plurality of chips is therefore required when fabricating the neo-wafer. This is also a factor that raises the cost for the layered chip package.

U.S. Pat. No. 7,127,807 B2 discloses a multilayer module formed by stacking a plurality of active layers each including a flexible polymer substrate with at least one electronic element and a plurality of electrically-conductive traces formed within the substrate. U.S. Pat. No. 7,127,807 B2 further discloses a manufacturing method for a multilayer module as described below. In the manufacturing method, a module array stack is fabricated by stacking a plurality of module arrays each of which includes a plurality of multilayer modules arranged in two orthogonal directions. The module array stack is then cut into a module stack which is a stack of a plurality of multilayer modules. Next, a plurality of electrically-conductive lines are formed on the respective side surfaces of the plurality of multilayer modules included in the module stack. The module stack is then separated from each other into individual multilayer modules.

With the multilayer module disclosed in U.S. Pat. No. 7,127,807 B2, it is impossible to increase the proportion of the area occupied by the electronic element in each active layer, and consequently it is difficult to achieve higher integration.

For a wafer to be cut into a plurality of chips, the yield of the chips, that is, the rate of conforming chips with respect to all chips obtained from the wafer, is 90% to 99% in many cases. Since a layered chip package includes a plurality of chips, the rate of layered chip packages in which all of the plurality of chips are conforming ones is lower than the yield of the chips. The larger the number of chips included in each layered chip package, the lower the rate of layered chip packages in which all of the chips are conforming ones.

A case will now be considered where a memory device such as a flash memory is formed using a layered chip package. For a memory device such as a flash memory, a redundancy technique of replacing a defective column of memory cells with a redundant column of memory cells is typically employed so that the memory device can normally function even when some memory cells are defective. The redundancy technique can also be employed in the case of forming a memory device using a layered chip package. This makes it possible that, even if some of memory cells included in any chip are defective, the memory device can normally function while using the chip including the defective memory cells. Suppose, however, that a chip including a control circuit and a plurality of memory cells has become defective due to, for example, a wiring failure of the control circuit, and the chip cannot function normally even by employing the redundancy technique. In such a case, the defective chip is no longer usable. While the defective chip can be replaced with a conforming one, it increases the cost for the layered chip package.

U.S. Patent Application Publication No. 2007/0165461 A1 discloses a technique of identifying one or more defective flash memory dies in a flash memory device having a plurality of flash memory dies, and disabling memory access operations to each identified die.

In the case of forming a memory device using a layered chip package, one or more defective chips included in the layered chip package may be identified and access to such defective chips may be disabled in the same way as the technique disclosed in U.S. Patent Application Publication No. 2007/0165461 A1.

Disabling access to a defective chip in a layered chip package, however, gives rise to the following two problems. A first problem is that the defective chip is electrically connected to a plurality of terminals of the layered chip package by wiring, and such a connection can possibly cause malfunction of the layered chip package.

A second problem is that, for a layered chip package that includes a predetermined number of chips and is able to implement a memory device having a desired memory capacity when all the chips included in the layered chip package are conforming, simply disabling access to any defective chip included in the layered chip package is not sufficient for implementing the memory device having the desired memory capacity.

OBJECT AND SUMMARY OF THE INVENTION

It is an object of the present invention to provide a layered chip package including a plurality of semiconductor chips stacked, and a composite layered chip package and methods of manufacturing the same that make it possible to easily implement a package that provides, even if it includes a malfunctioning semiconductor chip, the same functions as those for the case where no malfunctioning semiconductor chip is included.

A layered chip package of the present invention includes: a main body having a top surface, a bottom surface, and four side surfaces; and wiring disposed on at least one of the side surfaces of the main body. The main body includes: a main part that includes a plurality of layer portions stacked and has a top surface and a bottom surface; and a plurality of first terminals that are disposed on the top surface of the main part and electrically connected to the wiring.

The plurality of layer portions include at least one first-type layer portion and at least one second-type layer portion. Each of the first-type and second-type layer portions includes a semiconductor chip. The first-type layer portion further includes a plurality of first-type electrodes that are electrically connected to the semiconductor chip and to the wiring. The second-type layer portion further includes a plurality of second-type electrodes that are electrically connected to the wiring and not to the semiconductor chip. The plurality of first terminals are formed by using the plurality of first-type or second-type electrodes of the uppermost one of the layer portions.

In the layered chip package of the present invention, the semiconductor chip of the first-type layer portion may be a normally functioning one, whereas the semiconductor chip of the second-type layer portion may be a malfunctioning one.

In the layered chip package of the present invention, the semiconductor chip may have a plurality of electrode pads. In such a case, the first-type layer portion may further include a first-type insulating layer disposed around the plurality of electrode pads. The first-type insulating layer may have a plurality of openings for exposing the plurality of electrode pads. The plurality of first-type electrodes may be electrically connected to the plurality of electrode pads through the plurality of openings. The second-type layer portion may further include a second-type insulating layer that covers the plurality of electrode pads so as to avoid exposure.

In the layered chip package of the present invention, the main body may further include a plurality of second terminals that are disposed on the bottom surface of the main part and electrically connected to the wiring. In such a case, at least either the first terminals or the second terminals may each include a solder layer made of a solder material, the solder layer being exposed in a surface of each of the first terminals or each of the second terminals.

In the layered chip package of the present invention, the semiconductor chip may have four side surfaces. Each of the first-type and second-type layer portions may further include an insulating portion that covers at least one of the four side surfaces of the semiconductor chip. In such a case, the insulating portion may have at least one end face that is located in the at least one of the side surfaces of the main body on which the wiring is disposed.

A method of manufacturing layered chip packages of the present invention is a method by which a plurality of layered chip packages of the invention are manufactured. The manufacturing method includes the steps of fabricating a layered substructure by stacking a plurality of substructures each of which includes an array of a plurality of preliminary layer portions, each of the preliminary layer portions being intended to become any one of the layer portions included in the main part, the substructures being intended to be cut later at positions of boundaries between every adjacent ones of the preliminary layer portions; and forming the plurality of layered chip packages from the layered substructure.

In the method of manufacturing the layered chip packages of the present invention, the semiconductor chip of the first-type layer portion may be a normally functioning one, whereas the semiconductor chip of the second-type layer portion may be a malfunctioning one. In such a case, the semiconductor chip may have a plurality of electrode pads. The first type layer portion may further include a first-type insulating layer disposed around the plurality of electrode pads. The first-type insulating layer may have a plurality of openings for exposing the plurality of electrode pads. The plurality of first-type electrodes may be electrically connected to the plurality of electrode pads through the plurality of openings. The second-type layer portion may further include a second-type insulating layer that covers the plurality of electrode pads so as to avoid exposure.

If the layered chip packages are configured as described above, the step of fabricating the layered substructure may include, as a series of steps for forming each of the substructures, the steps of fabricating a pre-substructure wafer that includes an array of a plurality of pre-semiconductor-chip portions, the pre-semiconductor-chip portions being intended to become the semiconductor chips, respectively; distinguishing the plurality of pre-semiconductor-chip portions included in the pre-substructure wafer into normally functioning pre-semiconductor-chip portions and malfunctioning pre-semiconductor-chip portions; and forming the first-type insulating layer and the first-type electrodes in the normally functioning pre-semiconductor-chip portions while forming the second-type insulating layer and the second-type electrodes in the malfunctioning pre-semiconductor-chip portions, so that the pre-substructure wafer is made into the substructure.

A composite layered chip package of the present invention includes a plurality of subpackages stacked, every vertically adjacent two of the subpackages being electrically connected to each other. Each of the plurality of subpackages includes: a main body having a top surface, a bottom surface and four side surfaces; and wiring disposed on at least one of the side surfaces of the main body. The main body includes: a main part that includes at least one first-type layer portion and has a top surface and a bottom surface; and a plurality of first terminals that are disposed on the top surface of the main part and electrically connected to the wiring. In at least one of the plurality of subpackages, the main part further includes at least one second-type layer portion.

Each of the first-type and second-type layer portions includes a semiconductor chip. The first-type layer portion further includes a plurality of first-type electrodes that are electrically connected to the semiconductor chip and to the wiring. The second-type layer portion further includes a plurality of second-type electrodes that are electrically connected to the wiring and not to the semiconductor chip. The plurality of first terminals are formed by using the plurality of first-type or second-type electrodes of the uppermost one of the layer portions in each of the subpackages. For any vertically adjacent two of the subpackages, the main body of the upper one of the subpackages further includes a plurality of second terminals that are disposed on the bottom surface of the main part and electrically connected to the wiring. The plurality of second terminals of the upper one of the subpackages are electrically connected to the plurality of first terminals of the lower one of the subpackages.

In the composite layered chip package of the present invention, the semiconductor chip of the first-type layer portion may be a normally functioning one, whereas the semiconductor chip of the second-type layer portion may be a malfunctioning one.

In the composite layered chip package of the present invention, the semiconductor chip may have a plurality of electrode pads. In such a case, the first-type layer portion may further include a first-type insulating layer disposed around the plurality of electrode pads. The first-type insulating layer may have a plurality of openings for exposing the plurality of electrode pads. The plurality of first-type electrodes may be electrically connected to the plurality of electrode pads through the plurality of openings. The second-type layer portion may further include a second-type insulating layer that covers the plurality of electrode pads so as to avoid exposure.

In the composite layered chip package of the present invention, for any vertically adjacent two of the subpackages, at least either the second terminals of the upper one of the subpackages or the first terminals of the lower one of the subpackages may each include a solder layer made of a solder material, the solder layer being exposed in a surface of each of the first terminals or each of the second terminals.

In the composite layered chip package of the present invention, the semiconductor chip may have four side surfaces. Each of the first-type and second-type layer portions may further include an insulating portion that covers at least one of the four side surfaces of the semiconductor chip. In such a case, the insulating portion may have at least one end face that is located in the at least one of the side surfaces of the main body on which the wiring is disposed.

A method of manufacturing the composite layered chip package of the present invention includes the steps of fabricating the plurality of subpackages; and stacking the plurality of subpackages and, for any vertically adjacent two of the subpackages, electrically connecting the plurality of second terminals of the upper one of the subpackages to the plurality of first terminals of the lower one of the subpackages.

For any vertically adjacent two of the subpackages, at least either the second terminals of the upper one of the subpackages or the first terminals of the lower one of the subpackages may each include a solder layer made of a solder material, the solder layer being exposed in a surface of each of the first terminals or each of the second terminals. In such a case, in the step of electrically connecting the plurality of second terminals of the upper one of the subpackages to the plurality of first terminals of the lower one of the subpackages, the solder layer may be heated to melt and then solidified to electrically connect the plurality of second terminals to the plurality of first terminals.

In the layered chip package of the present invention, the plurality of layer portions include at least one first-type layer portion and at least one second-type layer portion. The first-type layer portion includes a plurality of first-type electrodes that are electrically connected to the semiconductor chip and to the wiring. The second-type layer portion includes a plurality of second-type electrodes that are electrically connected to the wiring and not to the semiconductor chip. The plurality of first terminals are formed by using the plurality of first-type or second-type electrodes of the uppermost one of the layer portions. According to the layered chip package and the method of manufacturing the same of the present invention, it is possible to prevent malfunctioning semiconductor chips from being electrically connected to the wiring. The plurality of first terminals of the layered chip package of the present invention can be used to electrically connect the layered chip package with another layered chip package. This makes it possible to easily implement a package that includes a plurality of semiconductor chips stacked and that is capable of providing, even if it includes a malfunctioning semiconductor chip, the same functions as those for the case where no malfunctioning semiconductor chip is included.

According to the composite layered chip package and the method of manufacturing the same of the present invention, a plurality of subpackages can be stacked to easily implement a package that includes a plurality of semiconductor chips stacked and that is capable of providing, even if it includes a malfunctioning semiconductor chip, the same functions as those for the case where no malfunctioning semiconductor chip is included.

Other and further objects, features and advantages of the present invention will appear more fully from the following description.

BRIEF DESCRIPTION OF THE DRAWINGS

FIG. 22 is a cross-sectional view showing a part of a first layered substructure fabricated in a step that follows the step shown in FIG. 21.

FIG. 45 is an exploded perspective view of a composite layered chip package according to a second embodiment of the invention.

FIG. 46 is a perspective view showing the composite layered chip package of FIG. 45 as viewed from below.

DETAILED DESCRIPTION OF THE PREFERRED EMBODIMENTS

First Embodiment

Figure 1:
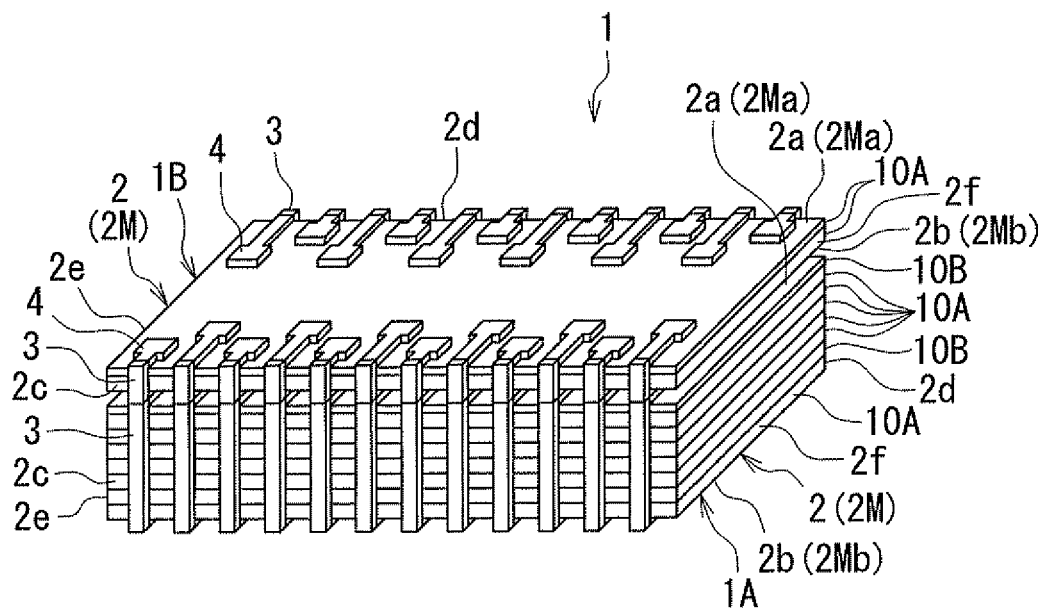
FIG. 1 is a perspective view of a composite layered chip package according to a first embodiment of the invention.
Figure 2:
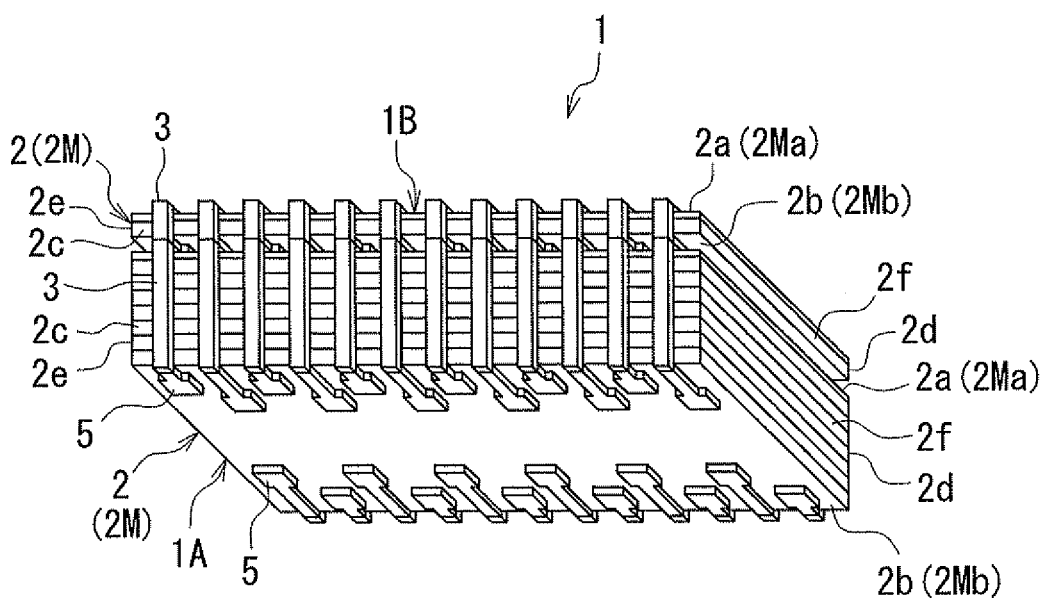
FIG. 2 is a perspective view showing the composite layered chip package of FIG. 1 as viewed from below.
Figure 3:
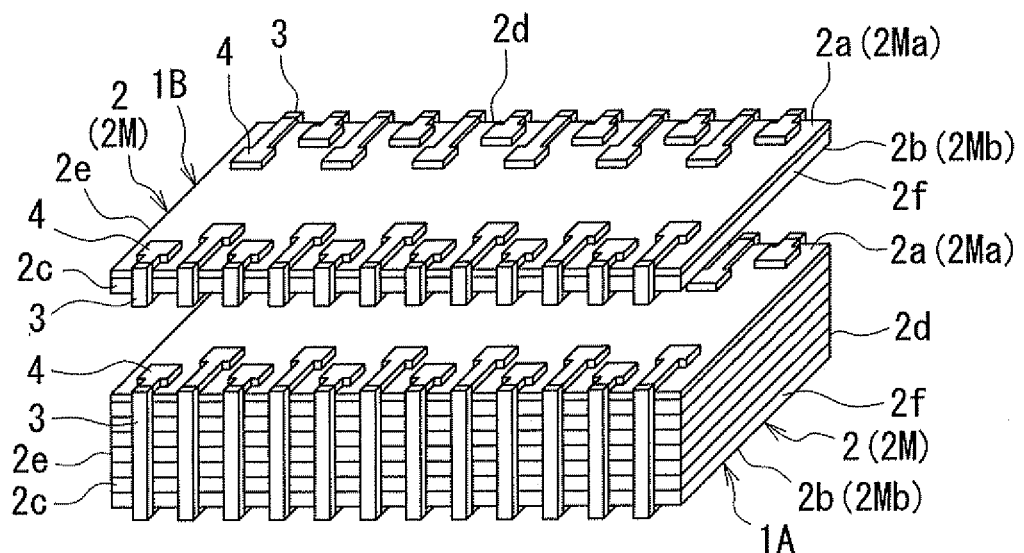
FIG. 3 is an exploded perspective view of the composite layered chip package of FIG. 1.
Figure 4:
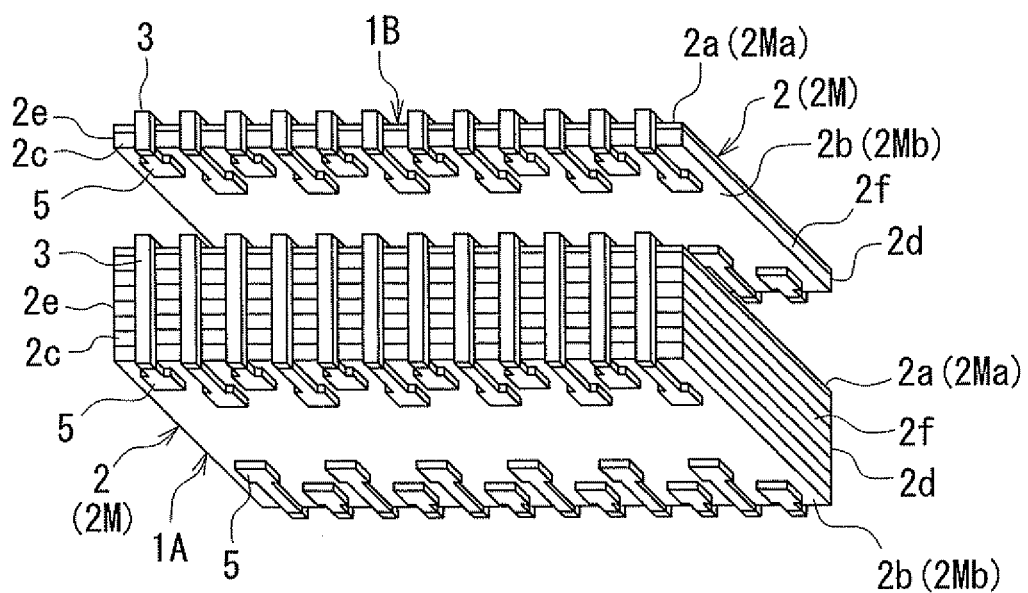
FIG. 4 is an exploded perspective view of the composite layered chip package of FIG. 2.
Figure 5:
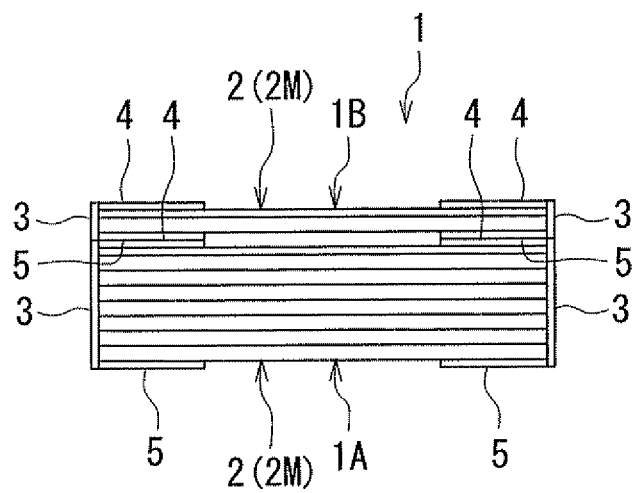
FIG. 5 is a side view of the composite layered chip package of FIG. 1.

Preferred embodiments of the present invention will now be described in detail with reference to the drawings. First, reference is made to FIG. 1 to FIG. 5 to describe the configuration of a composite layered chip package according to a first embodiment of the invention. FIG. 1 is a perspective view of the composite layered chip package according to the first embodiment of the invention. FIG. 2 is a perspective view showing the composite layered chip package of FIG. 1 as viewed from below. FIG. 3 is an exploded perspective view of the composite layered chip package of FIG. 1. FIG. 4 is an exploded perspective view of the composite layered chip package of FIG. 2. FIG. 5 is a side view of the composite layered chip package of FIG. 1.

The composite layered chip package 1 according to the present embodiment includes a plurality of subpackages stacked, every two vertically adjacent subpackages being electrically connected to each other. FIG. 1 to FIG. 5 show an example where the composite layered chip package 1 includes two subpackages 1A and 1B, the subpackage 1B lying on the top of the subpackage 1A. FIG. 3 and FIG. 4 show the state where the subpackages 1A and 1B are separated from each other. In the following description, any subpackage will be designated by reference symbol 1S.

Each of the subpackages 1A and 1B includes a main body 2 having a top surface 2a, a bottom surface 2b, and four side surfaces 2c, 2d, 2e and 2f. The side surfaces 2c and 2d are mutually opposite to each other. The side surfaces 2e and 2f are mutually opposite to each other. Each of the subpackages 1A and 1B further includes wiring 3 disposed on at least one of the side surfaces of the main body 2. In the example shown in FIG. 1 to FIG. 5, the wiring 3 is disposed on the two mutually opposite side surfaces 2c and 2d. The main body 2 has a main part 2M. The main part 2M includes at least one first-type layer portion 10A, and has a top surface 2Ma and a bottom surface 2Mb.

The main body 2 further has a plurality of first terminals 4 that are disposed on the top surface 2Ma of the main part 2M and electrically connected to the wiring 3. Of the subpackages 1A and 1B, at least the upper subpackage 1B has its main body 2 further having a plurality of second terminals 5. The second terminals 5 are disposed on the bottom surface 2Mb of the main part 2M and electrically connected to the wiring 3. In the example shown in FIG. 1 to FIG. 5, the main bodies 2 of both the subpackages 1A and 1B each have the plurality of first terminals 4 and the plurality of second terminals 5. The plurality of second terminals 5 of the upper subpackage 1B are electrically connected to the plurality of first terminals 4 of the lower subpackage 1A.

The composite layered chip package 1 may include a sealing part that is made of an insulating material and fills the gap between the subpackages 1A and 1B.

When the composite layered chip package 1 includes three or more subpackages 1S stacked, any two vertically adjacent subpackages 1S shall be configured so that the main body 2 of at least the upper subpackage 1S has the plurality of second terminals 5, and the plurality of second terminals 5 of the upper subpackage 1S are electrically connected to the plurality of first terminals 4 of the lower subpackage 1S.

In a subpackage 1S, at least either the terminals 4 or the terminals 5 may each include a solder layer made of a solder material, the solder layer being exposed in the surface of each of the terminals 4 or each of the terminals 5. In particular, given any two vertically adjacent subpackages 1S, it is preferred that at least either the second terminals 5 of the upper subpackage 1S or the first terminals 4 of the lower subpackage 1S each include the solder layer that is exposed in the surface of each of the terminals 4 or each of the terminals 5. In such a case, the solder layer is heated to melt and then solidified, whereby the plurality of second terminals 5 of the upper subpackage 1S are electrically connected to the plurality of first terminals 4 of the lower subpackage 1S.

The main part 2M of the main body 2 of at least one of the plurality of subpackages 1S further includes at least one second-type layer portion 10B. As will be described in detail later, each of the first-type layer portion 10A and the second-type layer portion 10B includes a semiconductor chip. The semiconductor chip of the first-type layer portion 10A is a normally functioning one, whereas the semiconductor chip of the second-type layer portion 10B is a malfunctioning one.

The first-type layer portion 10A further includes a plurality of first-type electrodes that are electrically connected to the semiconductor chip and to the wiring 3. The second-type layer portion 10B further includes a plurality of second-type electrodes that are electrically connected to the wiring 3 and not to the semiconductor chip. Each of the first-type and second-type electrodes has an end face located in the at least one of the side surfaces of the main body 2 on which the wiring 3 is disposed. Hereinafter, any layer portion will be designated by reference numeral 10. The plurality of first terminals 4 are formed by using the plurality of first-type or second-type electrodes of the uppermost layer portion 10 of the subpackage 1S.

In the example shown in FIG. 1 to FIG. 5, the main part 2M of the main body 2 of the subpackage 1A includes six first-type layer portions 10A and two second-type layer portions 10B, whereas the main part 2M of the main body 2 of the subpackage 1B includes two first-type layer portions 10A and no second-type layer portion 10B.

When the main part 2M of the main body 2 includes a plurality of layer portions regardless of the types of the layer portions, the plurality of layer portions are stacked on each other between the top surface 2Ma and the bottom surface 2Mb of the main part 2M. Every two vertically adjacent layer portions are bonded to each other with an adhesive, for example.

With a plurality of layer portions 10 included in the main part 2M of its main body 2, a subpackage 1S itself is a layered chip package, which is combined with one or more other subpackages 1S to form the composite layered chip package 1.

Figure 6:
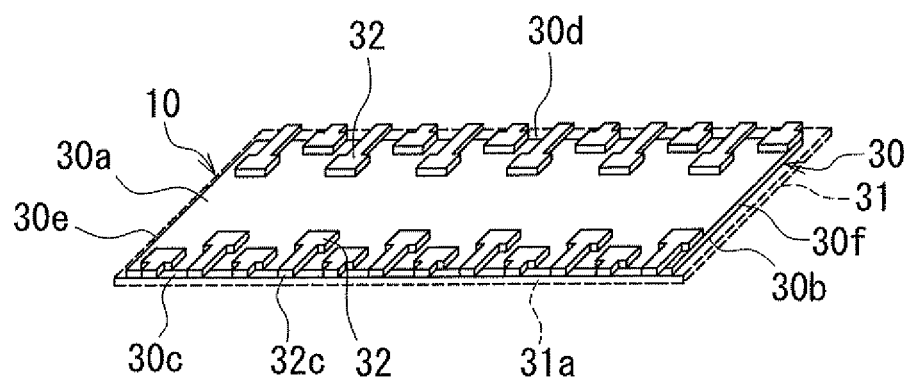
FIG. 6 is a perspective view showing a layer portion included in the composite layered chip package of FIG. 1.

FIG. 6 is a perspective view showing a part of a single layer portion 10. As shown in FIG. 6, the layer portion 10 includes a semiconductor chip 30. The semiconductor chip 30 has: a first surface 30a with a device formed thereon; a second surface 30b opposite to the first surface 30a; a first side surface 30c and a second side surface 30d that are mutually opposite to each other; and a third side surface 30e and a fourth side surface 30f that are mutually opposite to each other. The side surfaces 30c, 30d, 30e, and 30f face toward the side surfaces 2c, 2d, 2e, and 2f of the main body 2, respectively.

The layer portion 10 further includes an insulating portion 31 and a plurality of electrodes 32. The insulating portion 31 covers at least one of the four side surfaces of the semiconductor chip 30. The insulating portion 31 has at least one end face 31a that is located in the at least one of the side surfaces of the main body 2 on which the wiring is disposed. In the example shown in FIG. 6, the insulating portion 31 covers all of the four side surfaces of the semiconductor chip 30, and has four end faces 31a located in the four side surfaces of the main body 2.

In the first-type layer portion 10A, the plurality of electrodes 32 are electrically connected to the semiconductor chip 30 and to the wiring 3. In the second-type layer portion 10B, on the other hand, the plurality of electrodes 32 are electrically connected to the wiring 3 and not to the semiconductor chip 30. The electrodes 32 have their respective end faces 32c located in the at least one of the side surfaces of the main body 2 on which the wiring 3 is disposed. The wiring 3 is electrically connected to the end faces 32c. The plurality of electrodes 32 of the first-type layer portion 10A correspond to the first-type electrodes described above. The plurality of electrodes 32 of the second-type layer portion 10B correspond to the second-type electrodes described above. Hereinafter, the first-type electrodes will be designated by reference symbol 32A, and the second-type electrodes will be designated by reference symbol 32B.

As previously mentioned, the semiconductor chip 30 of the first-type layer portion 10A is a normally functioning one whereas the semiconductor chip 30 of the second-type layer portion 10B is a malfunctioning one. Hereinafter, a normally functioning semiconductor chip 30 will be referred to as a conforming semiconductor chip 30, and a malfunctioning semiconductor chip 30 will be referred to as a defective semiconductor chip 30.

In each of the layer portions 10 other than the uppermost layer portion 10 in a main body 2, the insulating portion 31 also covers the first surface 30a of the semiconductor chip 30 and the plurality of electrodes 32. In the uppermost layer portion 10 in a main body 2, the insulating portion 31 covers neither the first surface 30a of the semiconductor chip 30 nor the plurality of electrodes 32. The plurality of electrodes 32 of the uppermost layer portion 10 are thus exposed. The first terminals 4 are formed by using the plurality of electrodes 32, i.e., the plurality of first-type electrodes 32A or second-type electrodes 32B, of the uppermost layer portion 10.

The semiconductor chip 30 may be a memory chip that constitutes a memory such as a flash memory, DRAM, SRAM, MRAM, PROM, or FeRAM. In such a case, it is possible to implement a large-capacity memory by using the composite layered chip package 1 including a plurality of semiconductor chips 30. With the composite layered chip package 1 according to the present embodiment, it is also possible to easily implement a memory of various capacities such as 64 GB (gigabytes), 128 GB, and 256 GB, by changing the number of the semiconductor chips 30 to be included in the composite layered chip package 1.

Suppose that the semiconductor chip 30 includes a plurality of memory cells. In this case, even if one or more of the memory cells are defective, the semiconductor chip 30 is still conforming if it can function normally by employing the redundancy technique.

The semiconductor chips 30 are not limited to memory chips, and may be used for implementing other devices such as CPUs, sensors, and driving circuits for sensors. The composite layered chip package 1 according to the present embodiment is particularly suitable for implementing an SiP.

Figure 7:
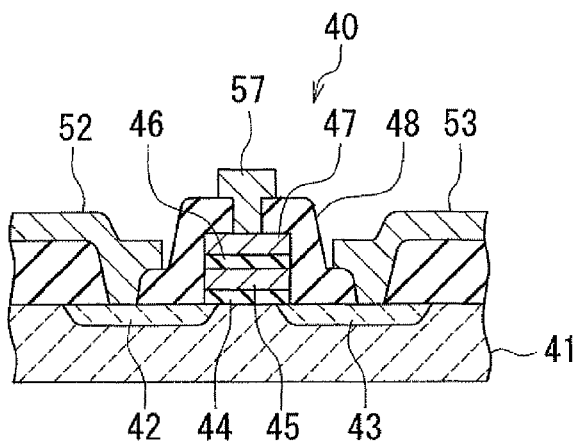
FIG. 7 is a cross-sectional view showing a part of the device included in the semiconductor chip.

Reference is now made to FIG. 7 to describe an example of device included in the semiconductor chip 30. By way of example, the following description will be given for a case where the device included in the semiconductor chip 30 is a circuit including a plurality of memory cells that constitute a memory. FIG. 7 shows one of the plurality of memory cells. The memory cell 40 includes a source 42 and a drain 43 formed near a surface of a P-type silicon substrate 41. The source 42 and the drain 43 are both N-type regions. The source 42 and the drain 43 are disposed at a predetermined distance from each other so that a channel composed of a part of the P-type silicon substrate 41 is provided between the source 42 and the drain 43. The memory cell 40 further includes an insulating film 44, a floating gate 45, an insulating film 46, and a control gate 47 that are stacked in this order on the surface of the substrate 41 at the location between the source 42 and the drain 43. The memory cell 40 further includes an insulating layer 48 that covers the source 42, the drain 43, the insulating film 44, the floating gate 45, the insulating film 46 and the control gate 47. The insulating layer 48 has contact holes that open in the tops of the source 42, the drain 43 and the control gate 47, respectively. The memory cell 40 includes a source electrode 52, a drain electrode 53, and a control gate electrode 57 that are formed on the insulating layer 48 at locations above the source 42, the drain 43 and the control gate 47, respectively. The source electrode 52, the drain electrode 53 and the control gate electrode 57 are connected to the source 42, the drain 43 and the control gate 47, respectively, through the corresponding contact holes.

Next, a description will be given of a method of manufacturing the composite layered chip package 1 according to the present embodiment. The method of manufacturing the composite layered chip package 1 according to the embodiment includes the steps of fabricating a plurality of subpackages 1S; and stacking the plurality of subpackages 1S and, for any two vertically adjacent subpackages 1S, electrically connecting the plurality of second terminals 5 of the upper subpackage 1S to the plurality of first terminals 4 of the lower subpackage 1S.

The step of fabricating a plurality of subpackages 1S includes, as a series of steps for forming each subpackage 1S, the steps of fabricating at least one substructure that includes an array of a plurality of preliminary layer portions, each of the preliminary layer portions being intended to become any one of the layer portions 10 included in the main part 2M, the substructure being intended to be cut later at the positions of the boundaries between adjacent preliminary layer portions; and forming the subpackage 1S from the at least one substructure.

Figure 8:
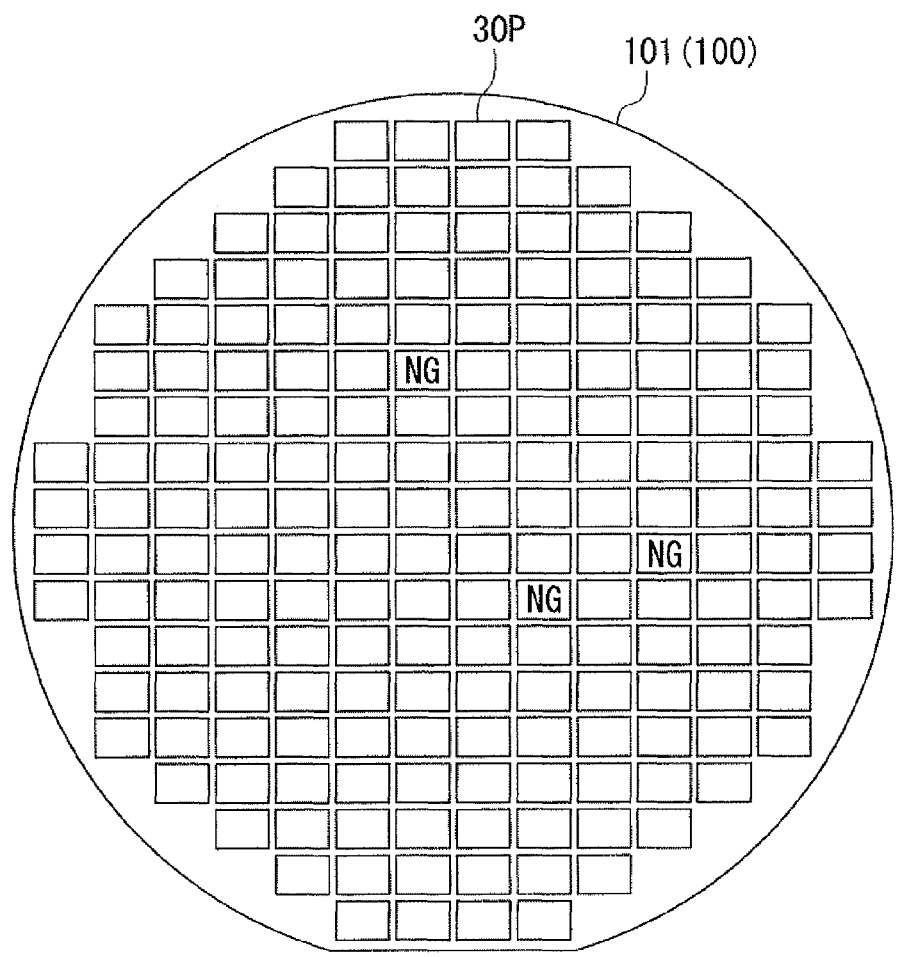
FIG. 8 is a plan view showing a pre-substructure wafer fabricated in a step of a method of manufacturing the composite layered chip package according to the first embodiment of the invention.
Figure 9:
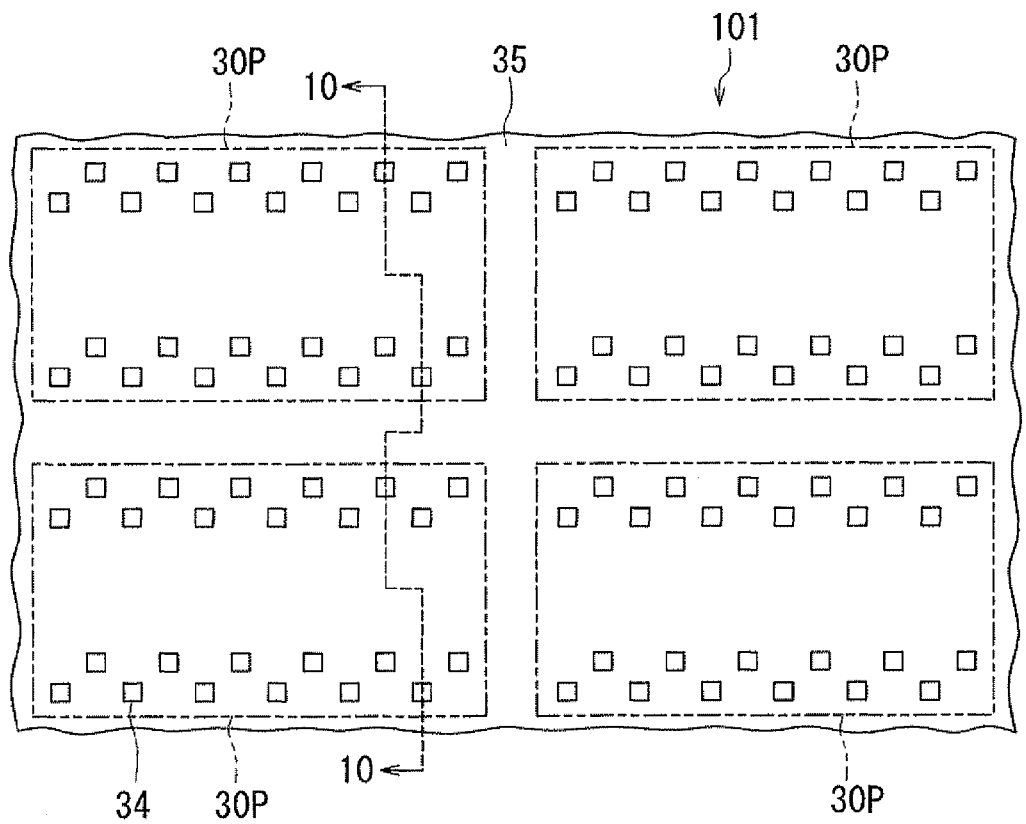
FIG. 9 is a magnified plan view of a part of the pre-substructure wafer shown in FIG. 8.
Figure 10:
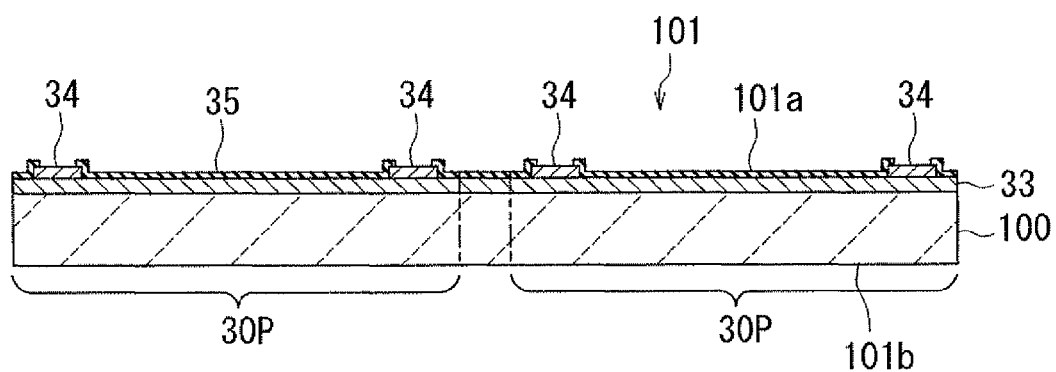
FIG. 10 shows a cross section taken along line 10-10 of FIG. 9.

Now, with reference to FIG. 8 to FIG. 22, a detailed description will be given of the step of fabricating at least one substructure. The following description will be given for a case where a plurality of substructures are fabricated. In the step of fabricating at least one substructure, a pre-substructure wafer 101 is initially fabricated. The pre-substructure wafer 101 includes an array of a plurality of pre-semiconductor-chip portions 30P that are intended to become individual semiconductor chips 30. FIG. 8 is a plan view of the pre-substructure wafer 101. FIG. 9 is a magnified plan view of a part of the pre-substructure wafer 101 shown in FIG. 8. FIG. 10 shows a cross section taken along line 10-10 of FIG. 9.

Specifically, in the step of fabricating the pre-substructure wafer 101, a semiconductor wafer 100 having two mutually opposite surfaces is subjected to processing, such as a wafer process, at one of the two surfaces. This forms the pre-substructure wafer 101 including an array of a plurality of pre-semiconductor-chip portions 30P, each of the pre-semiconductor-chip portions 30P including a device. In the pre-substructure wafer 101, the plurality of pre-semiconductor-chip portions 30P may be in a row, or in a plurality of rows such that a number of pre-semiconductor-chip portions 30P are arranged both in vertical and horizontal directions. In the following description, assume that the plurality of pre-semiconductor-chip portions 30P in the pre-substructure wafer 101 are in a plurality of rows such that a number of pre-semiconductor-chip portions 30P are arranged both in vertical and horizontal directions. The semiconductor wafer 100 may be a silicon wafer, for example. The wafer process is a process in which a semiconductor wafer is processed into a plurality of devices that are not yet separated into a plurality of chips. For ease of understanding, FIG. 8 depicts the pre-semiconductor chip portions 30P larger relative to the semiconductor wafer 100. For example, if the semiconductor wafer 100 is a 12-inch wafer and the top surface of each pre-semiconductor-chip portion 30 is 8 to 10 mm long at each side, then 700 to 900 pre-semiconductor-chip portions 30P are obtainable from a single semiconductor wafer 100.

As shown in FIG. 10, the pre-semiconductor-chip portions 30P include a device-forming region 33 that is formed near one of the surfaces of the semiconductor wafer 100. The device-forming region 33 is a region where devices are formed by processing the one of the surfaces of the semiconductor wafer 100. The pre-semiconductor-chip portions 30P further include a plurality of electrode pads 34 disposed on the device-forming region 33, and a passivation film 35 disposed on the device-forming region 33. The passivation film 35 is made of an insulating material such as phospho-silicate-glass (PSG), silicon nitride, or polyimide resin. The passivation film 35 has a plurality of openings for exposing the top surfaces of the plurality of electrode pads 34. The plurality of electrode pads 34 are located in the positions corresponding to the plurality of electrodes 32 to be formed later, and are electrically connected to the devices formed in the device-forming region 33. Hereinafter, the surface of the pre-substructure wafer 101 located closer to the plurality of electrode pads 34 and the passivation film 35 will be referred to as a first surface 101a, and the opposite surface will be referred to as a second surface 101b.

In the step of fabricating at least one substructure, next, a wafer sort test is performed to distinguish the plurality of pre-semiconductor-chip portions 30P included in the pre-substructure wafer 101 into normally functioning pre-semiconductor-chip portions and malfunctioning pre-semiconductor-chip portions. In this step, a probe of a testing device is brought into contact with the plurality of electrode pads 34 of each pre-semiconductor-chip portion 30P so that whether the pre-semiconductor-chip portion 30P functions normally or not is tested with the testing device. In FIG. 8, the pre-semiconductor-chip portions 30P marked with "NG" are malfunctioning ones, and the other pre-semiconductor-chip portions 30P are normally functioning ones. This step provides location information on the normally functioning pre-semiconductor-chip portions 30P and the malfunctioning pre-semiconductor-chip portions 30P in each pre-substructure wafer 101. The location information is used in a step to be performed later. The passivation film 35 may be formed after the wafer sort test, and may thus be yet to be formed at the time of performing the wafer sort test.

Figure 11:
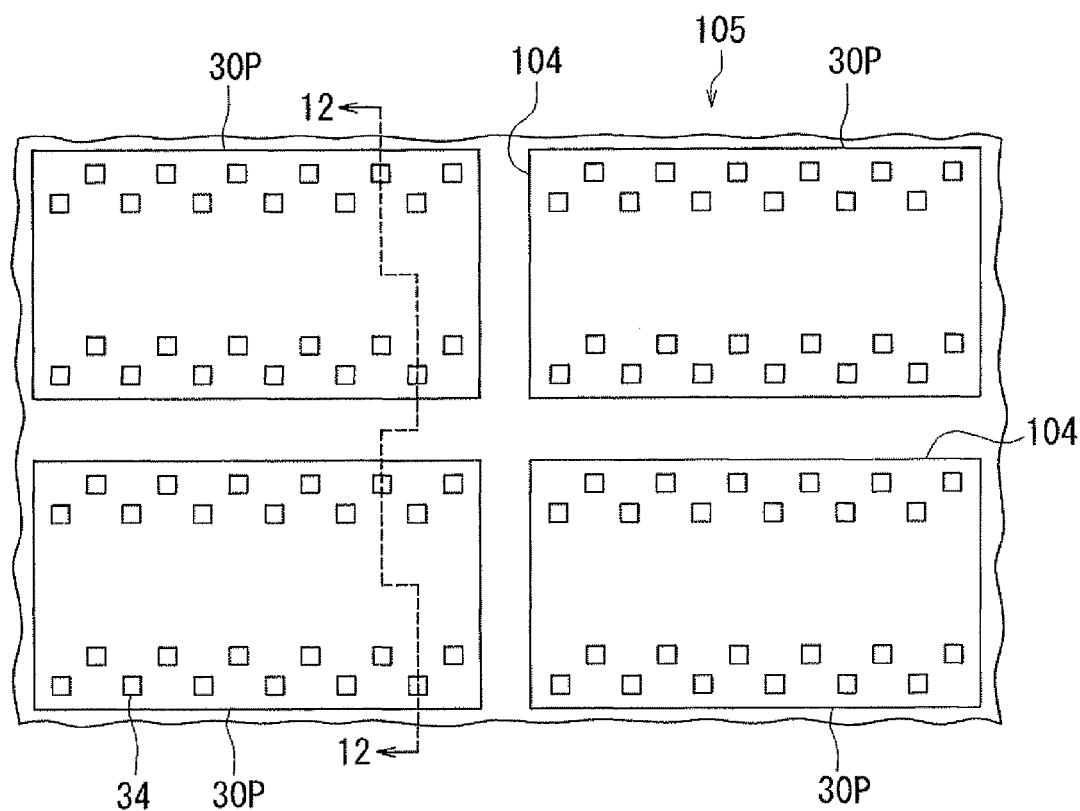
FIG. 11 is a plan view showing a step that follows the step shown in FIG. 9.
Figure 12:
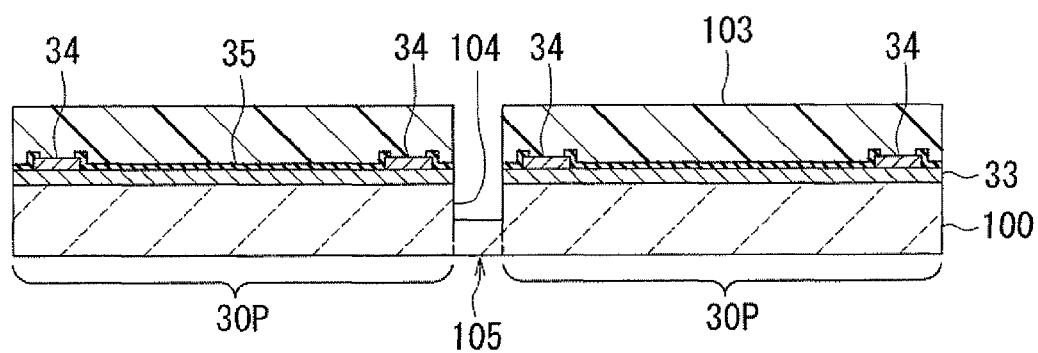
FIG. 12 shows a cross section taken along line 12-12 of FIG. 11.

FIG. 11 is a plan view showing a step that follows the step shown in FIG. 9. FIG. 12 shows a cross section taken along line 12-12 of FIG. 11. In this step, a protection layer 103 is initially formed to cover the first surface 101a of the pre-substructure wafer 101. The protection layer 103 is formed of a photoresist, for example. Next, a plurality of grooves 104 that open in the first surface 101a of the pre-substructure wafer 101 are formed in the pre-substructure wafer 101 so as to define the respective areas of the plurality of pre-semiconductor-chip portions 30P. Note that the protection layer 103 is omitted in FIG. 11.

In the positions of the boundaries between every two adjacent pre-semiconductor-chip portions 30P, the grooves 104 are formed to pass through the boundaries between every two adjacent pre-semiconductor-chip portions 30P. The grooves 104 are formed such that their bottoms do not reach the second surface 101b of the pre-substructure wafer 101. The grooves 104 have a width in the range of 50 to 150 μm, for example. The grooves 104 have a depth in the range of 20 to 80 μm, for example.

The grooves 104 may be formed using a dicing saw or by performing etching, for example. The etching may be reactive ion etching or anisotropic wet etching using KOH as the etching solution, for example. When forming the grooves 104 by etching, the protection layer 103 made of photoresist may be patterned by photolithography to form the etching mask. The protection layer 103 is removed after the formation of the grooves 104. A pre-polishing substructure main body 105 is thus formed by the pre-substructure wafer 101 with the plurality of grooves 104 formed therein.

Figure 13:
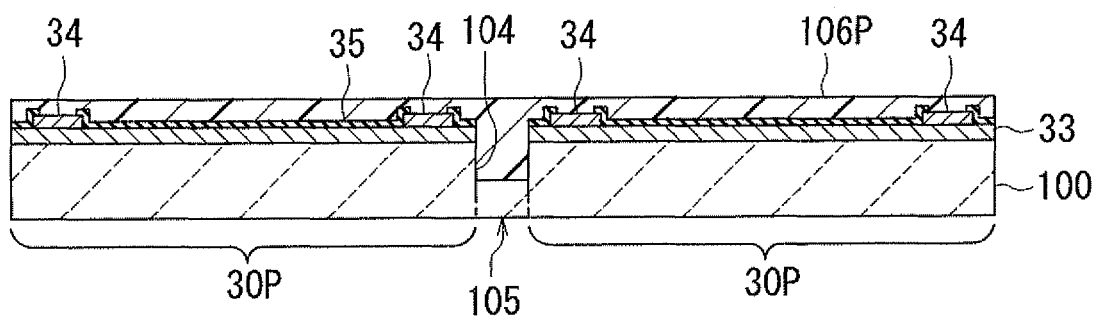
FIG. 13 is a cross-sectional view showing a step that follows the step shown in FIG. 12.

FIG. 13 shows a step that follows the step shown in FIG. 12. In this step, an insulating film 106P is formed to fill the plurality of grooves 104 of the pre-polishing substructure main body 105 and to cover the plurality of electrode pads 34 and the passivation film 35. The insulating film 106P is to become a part of the insulating portion 31 later. The insulating film 106P may be formed of a resin such as an epoxy resin or a polyimide resin. The insulating film 106P may also be formed of a photosensitive material such as a sensitizer-containing polyimide resin. The insulating film 106P may also be formed of an inorganic material such as silicon oxide or silicon nitride.

The insulating film 106P is preferably formed of a resin having a low thermal expansion coefficient. If the insulating film 106P is formed of a resin having a low thermal expansion coefficient, it becomes easy to cut the insulating film 106P when it is cut later with a dicing saw.

The insulating film 106P is preferably transparent. If the insulating film 106P is transparent, alignment marks that are recognizable through the insulating film 106P can be formed on the insulating film 106P. Such alignment marks facilitates alignment of a plurality of substructures to be stacked.

The insulating film 106P may include a first layer that fills the plurality of grooves 104 and a second layer that covers the first layer, the plurality of electrode pads 34 and the passivation film 35. In such a case, the first layer and the second layer may be formed of the same material or different materials. The first layer is preferably formed of a resin having a low thermal expansion coefficient. The second layer may be formed of a photosensitive material such as a sensitizer-containing polyimide resin. The first layer may be flattened at the top by, for example, ashing or chemical mechanical polishing (CMP), before forming the second layer on the first layer.

If the passivation film 35 is not formed by the time of performing the wafer sort test, the second layer of the insulating film 106P may be used as the passivation film. In such a case, the second layer may be formed of an inorganic material such as silicon oxide or silicon nitride. If the second layer of the insulating film 106P is to be used as the passivation film, the plurality of openings for exposing the top surfaces of the plurality of electrode pads 34 are not formed in the second layer as initially formed.

Figure 14:
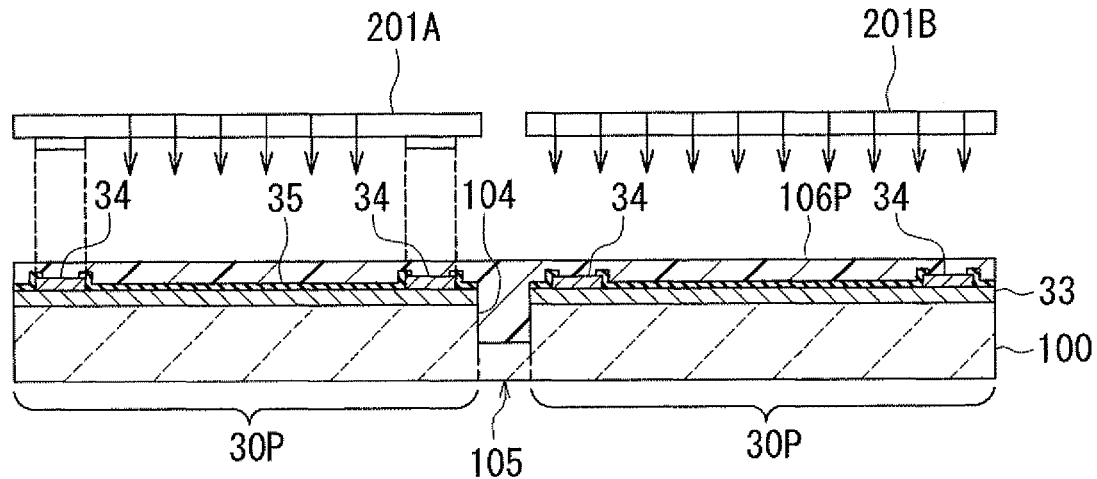
FIG. 14 is a cross-sectional view showing a step that follows the step shown in FIG. 13.
Figure 15:
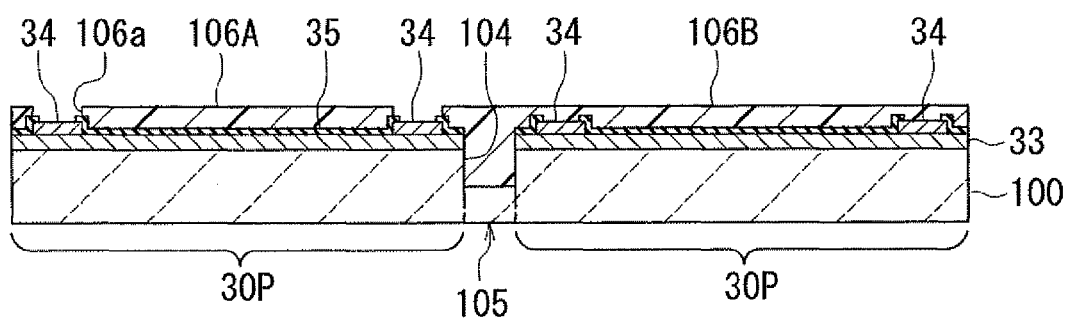
FIG. 15 is a cross-sectional view showing a step that follows the step shown in FIG. 14.

Reference is now made to FIG. 14 and FIG. 15 to describe the step of forming the plurality of openings for exposing the plurality of electrode pads 34 in the insulating film 106P in the normally-functioning pre-semiconductor-chip portions 30P. FIG. 14 shows a step that follows the step shown in FIG. 13. FIG. 15 shows a step that follows the step shown in FIG. 14.

Here, a description will initially be given of a case where the entire insulating film 106P or the second layer of the insulating film 106P is formed of a negative photosensitive material and the openings are formed in the insulating film 106P by photolithography. In this case, all the pre-semiconductor-chip portions 30P are simultaneously subjected to the exposure of the insulating film 106P by using a mask 201A shown in FIG. 14. The mask 201A has such a pattern that the areas of the insulating film 106P where to form the openings are not irradiated with light while the other areas are irradiated with light. The non-irradiated areas of the insulating film 106P are soluble in a developing solution, and the irradiated areas become insoluble in the developing solution.

Next, using a stepping projection exposure apparatus, or a so-called stepper, the insulating film 106P is selectively exposed in the malfunctioning pre-semiconductor-chip portions 30P only, using a mask 201B shown in FIG. 14. This exposure process uses the location information on the normally functioning pre-semiconductor-chip portions 30P and the malfunctioning pre-semiconductor-chip portions 30P in each pre-substructure wafer 101 which was obtained by the wafer sort test. In FIG. 14, the pre-semiconductor-chip portion 30P on the left is a normally functioning one, whereas the pre-semiconductor-chip portion 30P on the right is a malfunctioning one. The mask 201B entirely transmits light. As a result of this exposure process, the entire insulating film 106P in the malfunctioning pre-semiconductor-chip portions 30P becomes insoluble in the developing solution.

Next, the insulating film 106P is developed with the developing solution. As a result, as shown in FIG. 15, a plurality of openings 106a for exposing the plurality of electrode pads 34 are formed in the insulating film 106P in the normally functioning pre-semiconductor chip portion 30P (the left side). On the other hand, no openings 106P are formed in the insulating film 106P in the malfunctioning pre-semiconductor chip portion 30P (the right side). After the development, the area of the insulating film 106P corresponding to the normally functioning pre-semiconductor chip portion 30P becomes a first-type insulating layer 106A, and the area corresponding to the malfunctioning pre-semiconductor chip portion 30P becomes a second-type insulating layer 106B. The first-type insulating layer 106A has the plurality of openings 106a for exposing the plurality of electrode pads 34, and is disposed around the plurality of electrode pads 34. The second-type insulating layer 106B covers the plurality of electrode pads 34 so as to avoid exposure.

Now, an example of the method for forming the plurality of openings 106a in the insulating film 106P will be described for the case where the entire insulating film 106P or the second layer of the insulating film 106P is formed of a non-photosensitive material. In the example, a negative photoresist layer is initially formed on the insulating film 106P. The photoresist layer is then exposed and developed by the same method as with the exposure and development of the foregoing insulating film 106P. Consequently, in the normally functioning pre-semiconductor-chip portions 30P, a plurality of openings are formed in the photoresist layer at positions corresponding to the plurality of electrode pads 34. Meanwhile, no opening is formed in the photoresist layer in the malfunctioning pre-semiconductor-chip portions 30P. Next, the insulating film 106P is selectively etched by using the photoresist layer as the etching mask, whereby the plurality of openings 106a are formed in the insulating film 106P. The photoresist layer may be subsequently removed, or may be left and used as part of the insulating layers 106A and 106B.

Figure 16:
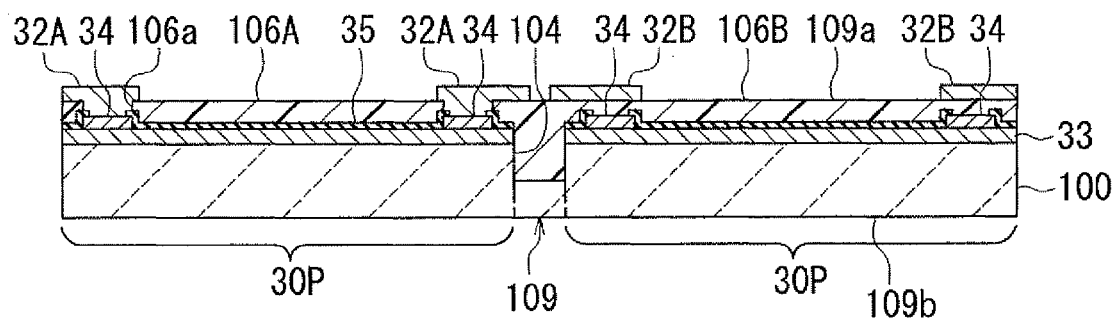
FIG. 16 is a cross-sectional view showing a step that follows the step shown in FIG. 15.
Figure 17:
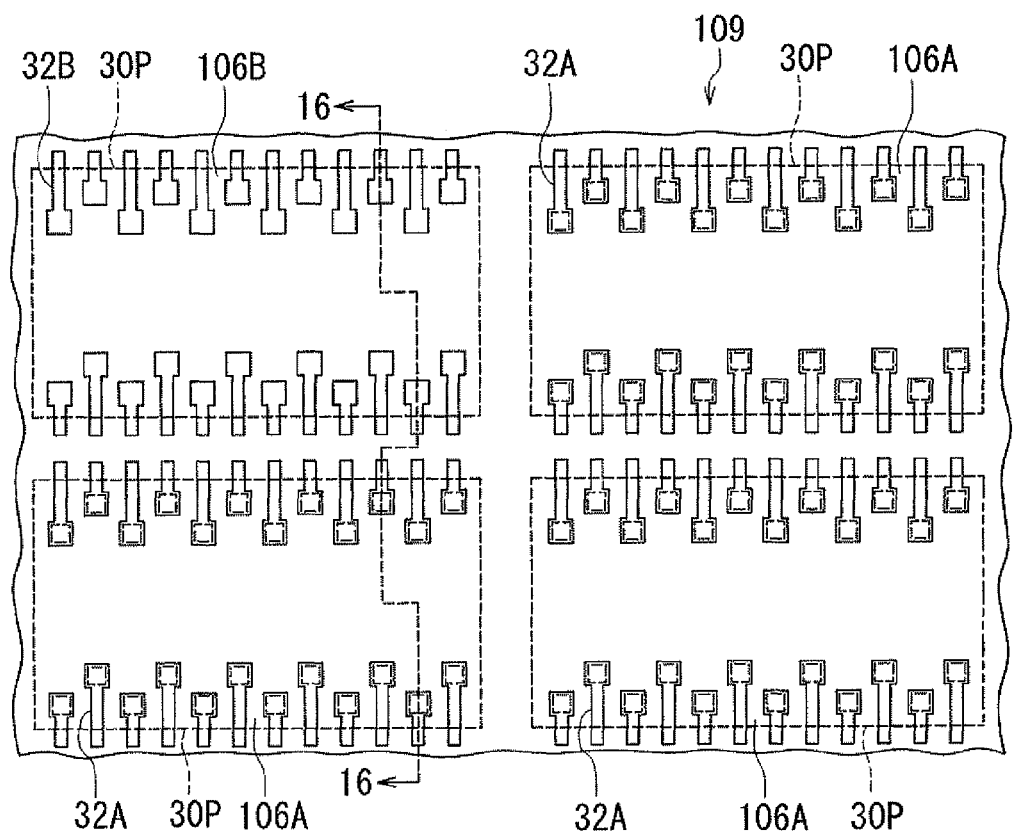
FIG. 17 is a plan view showing the step of FIG. 16.

FIG. 16 and FIG. 17 show a step that follows the step shown in FIG. 15. In this step, the plurality of electrodes 32 are formed on the insulating layers 106A and 106B by plating, for example. In the normally functioning pre-semiconductor chip portions 30P, the plurality of electrodes 32 are electrically connected to the respective corresponding electrode pads 34 through the plurality of openings 106a of the insulating layer 106A. The plurality of electrodes 32 in the normally functioning pre-semiconductor-chip portions 30P become the first-type electrodes 32A. In the malfunctioning pre-semiconductor-chip portions 30P, on the other hand, the plurality of electrodes 32 are not electrically connected to the corresponding electrode pads 34 since no openings 106a are formed in the insulating layer 106B. The plurality of electrodes 32 in the malfunctioning pre-semiconductor-chip portions 30P become the second-type electrodes 32B. A pre-polishing substructure 109 shown in FIG. 16 and FIG. 17 is fabricated thus. The pre-polishing substructure 109 has a first surface 109a corresponding to the first surface 101a of the pre-substructure wafer 101, and a second surface 109b corresponding to the second surface 101b of the pre-substructure wafer 101.

The electrodes 32 are formed of a conductive material such as Cu. In the case of forming the electrodes 32 by plating, a seed layer for plating is initially formed. Next, a photoresist layer is formed on the seed layer. The photoresist layer is then patterned by photolithography to form a frame that has a plurality of openings for the plurality of electrodes 32 to be accommodated in later. Next, plating layers that are intended to constitute respective portions of the electrodes 32 are formed by plating on the seed layer in the openings of the frame. The plating layers are 5 to 15 µm thick, for example. Next, the frame is removed, and portions of the seed layer other than those lying under the plating layers are also removed by etching. The plating layers and the remaining portions of the seed layer under the plating layers thus form the electrodes 32.

Figure 18:
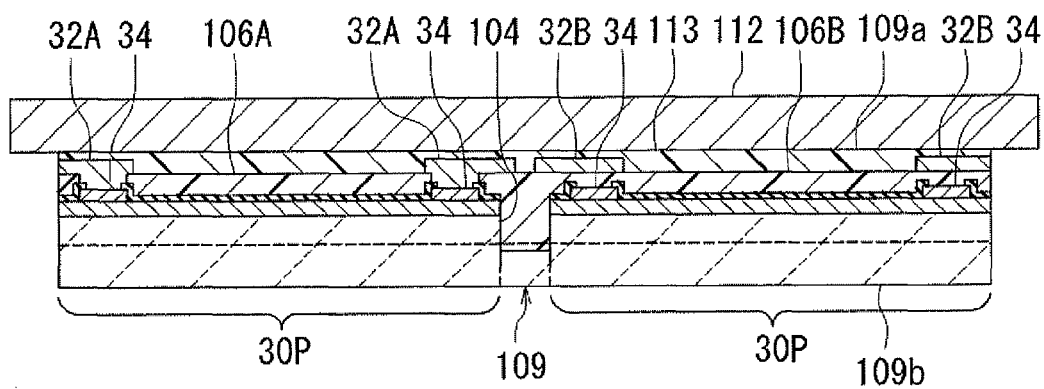
FIG. 18 is a cross-sectional view showing a step that follows the step shown in FIG. 16.

FIG. 18 shows a step that follows the step shown in FIG. 16. In this step, using an insulating adhesive, the pre-polishing substructure 109 is bonded to a plate-shaped jig 112 shown in FIG. 18, with the first surface 109a of the pre-polishing substructure 109 arranged to face a surface of the jig 112. The pre-polishing substructure 109 bonded to the jig 112 will hereinafter be referred to as a first pre-polishing substructure 109. In FIG. 18, the reference numeral 113 indicates an insulating layer formed by the adhesive.

Figure 19:
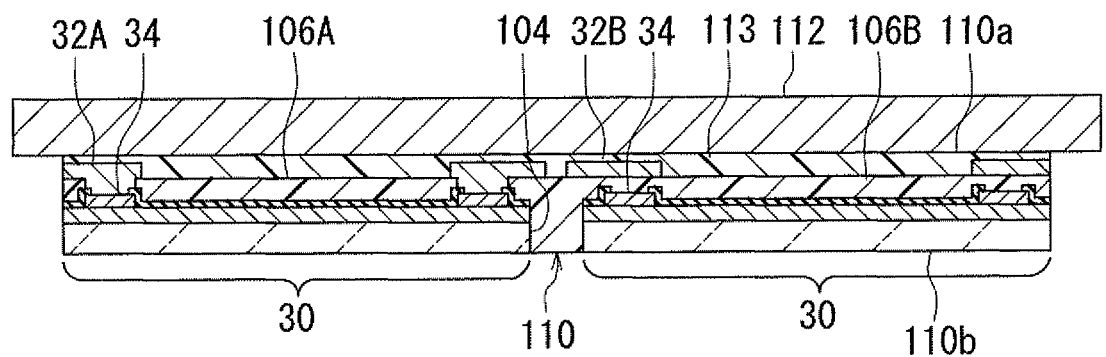
FIG. 19 is a cross-sectional view showing a step that follows the step shown in FIG. 18.

FIG. 19 shows a step that follows the step shown in FIG. 18. In this step, the second surface 109b of the first pre-polishing substructure 109 is polished. This polishing is performed until the plurality of grooves 104 are exposed. The broken line in FIG. 18 indicates the level of the second surface 109b after the polishing. By polishing the second surface 109b of the first pre-polishing substructure 109, the first pre-polishing substructure 109 is thinned. This forms a substructure 110 in the state of being bonded to the jig 112. The substructure 110 has a thickness of 20 to 80 µm, for example. Hereinafter, the substructure 110 bonded to the jig 112 will be referred to as a first substructure 110. The first substructure 110 has a first surface 110a corresponding to the first surface 109a of the first pre-polishing substructure 109, and a second surface 110b opposite to the first surface 110a. The second surface 110b is the polished surface. By polishing the second surface 109b of the first pre-polishing substructure 109 until the plurality of grooves 104 are exposed, the plurality of pre-semiconductor-chip portions 30P are separated from each other into individual semiconductor chips 30.

Figure 20:
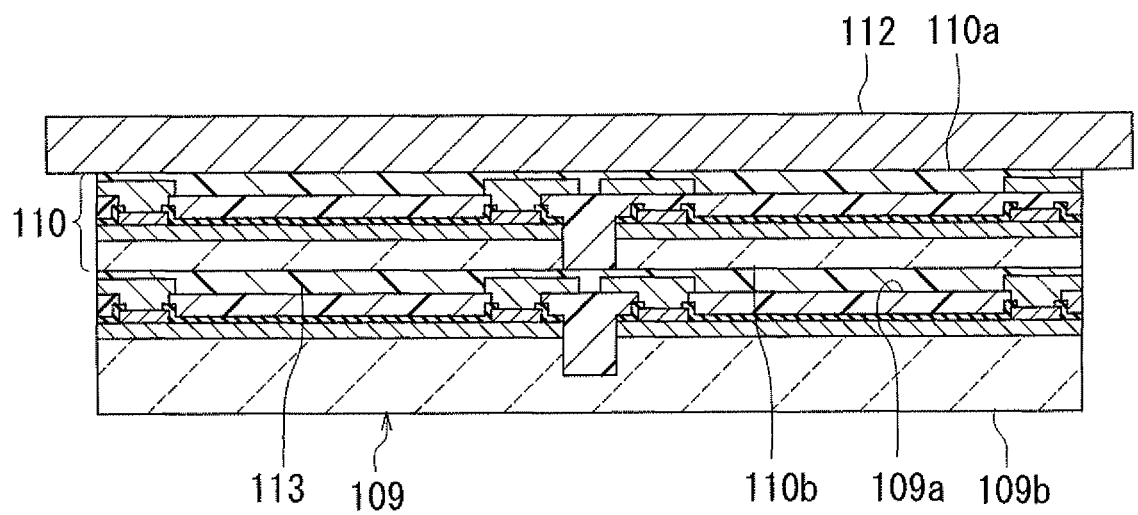
FIG. 20 is a cross-sectional view showing a step that follows the step shown in FIG. 19.

FIG. 20 shows a step that follows the step shown in FIG. 19. In this step, using an insulating adhesive, a pre-polishing substructure 109 is initially bonded to the first substructure 110 bonded to the jig 112. The pre-polishing substructure 109 is bonded to the first substructure 110 with the first surface 109a arranged to face the polished surface, i.e., the second surface 110b, of the first substructure 110. Hereinafter, the pre-polishing substructure 109 to be bonded to the first substructure 110 will be referred to as a second pre-polishing substructure 109. The insulating layer 113 formed by the adhesive between the first substructure 110 and the second pre-polishing substructure 109 covers the plurality of electrodes 32 of the second pre-polishing substructure 109, and is to become part of the insulating portion 31 later.

Next, although not shown, the second surface 109b of the second pre-polishing substructure 109 is polished. This polishing is performed until the plurality of grooves 104 are exposed. By polishing the second surface 109b of the second pre-polishing substructure 109, the second pre-polishing substructure 109 is thinned. This forms a second substructure 110 in the state of being bonded to the first substructure 110. The second substructure 110 has a thickness of, for example, 20 to 80 μm, as does the first substructure 110.

Figure 21:
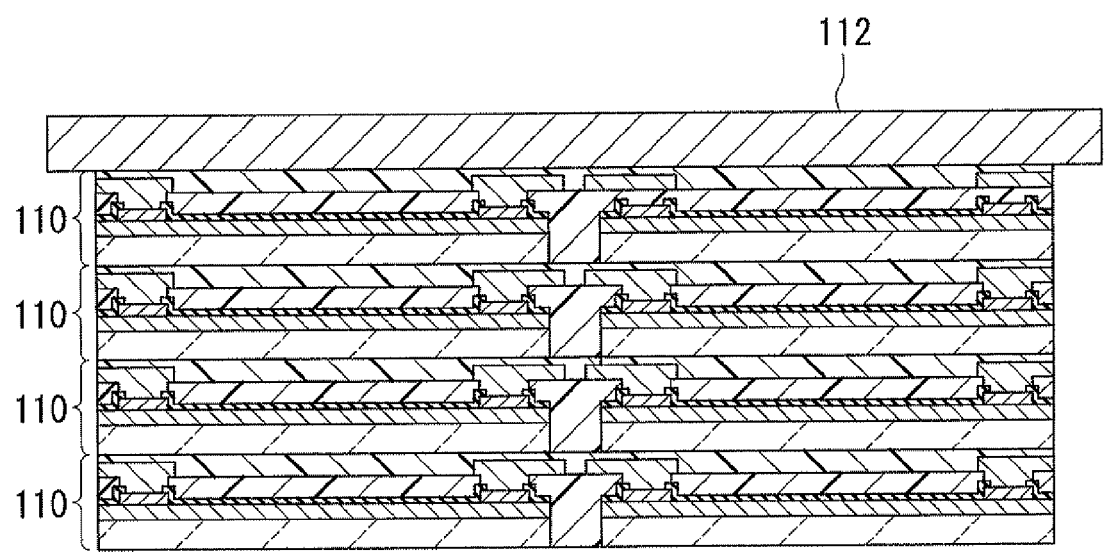
FIG. 21 is a cross-sectional view showing a step that follows the step shown in FIG. 20.

The same step as shown in FIG. 20 may subsequently be repeated to form three or more substructures 110 into a stack. FIG. 21 shows the case where four substructures 110 are formed into a stack.

FIG. 22 shows a step that follows the step shown in FIG. 21. After the same step as shown in FIG. 20 is repeated to form a predetermined number of substructures 110 into a stack, the stack of the predetermined number of substructures 110 is released from the jig 112. FIG. 22 shows an example where a stack of eight substructures 110 is formed.

Next, as shown in FIG. 22, the insulating layer 113 is removed from the uppermost substructure 110 of the stack. This exposes the plurality of electrodes 32 of the uppermost substructure 110. The plurality of first terminals 4 are formed by using the plurality of electrodes 32 thus exposed.

The plurality of second terminals 5 are formed on the bottom surface of the lowermost substructure 110 of the stack. The terminals 5 are formed of a conductive material such as Cu or Au. The terminals 5 are formed by the same method as for the electrodes 32, i.e., by plating.

At least either the terminals 4 or the terminals 5 may each include a solder layer made of a solder material, the solder layer being exposed in the surface of each of the terminals 4 or each of the terminals 5. An example of the solder material is AuSn. The solder layer has a thickness in the range of 1 to 2 μm, for example. If the terminals 4 are to include the solder layer, the solder layer is formed on the surface of each of the electrodes 32 of the uppermost substructure 110 directly or via an underlayer. The solder layer is formed by plating, for example. If the terminals 5 are to include the solder layer, a conductor layer that is to become portions of the terminals 5 is formed on the bottom surface of the lowermost substructure 110 of the stack, using a conductive material such as Cu or Au. The solder layer is then formed on the surface of the conductor layer directly or via an underlayer by plating, for example.

AuSn is highly adhesive to Au. When either the terminals 4 or the terminals 5 each include a solder layer made of AuSn, it is preferred that the other of the terminals 4 and 5 each include an Au layer that is exposed in the surface of each of the terminals 4 or 5. The Au layer is formed by plating or sputtering, for example. The melting point of AuSn varies according to the ratio between Au and Sn. For example, if the ratio between Au and Sn is 1:9 by weight, AuSn has a melting point of 217° C. If the ratio between Au and Sn is 8:2 by weight, AuSn has a melting point of 282° C.

Consequently, there is formed a first layered substructure 115 including a plurality of substructures 110 stacked. Each of the substructures 110 includes an array of a plurality of preliminary layer portions 10P. Each of the preliminary layer portions 10P is to become any one of the layer portions 10 included in the main part 2M of the main body 2. The substructures 110 are to be cut later in the positions of the boundaries between every adjacent preliminary layer portions 10P. In FIG. 22, the reference symbol 110C indicates the cutting positions in the substructures 110. The first layered substructure 115 includes an array of a plurality of pre-separation main bodies 2P that are to be separated from each other into individual main bodies 2 later. In the example shown in FIG. 22, each of the pre-separation main bodies 2P includes eight preliminary layer portions 10P.

Now, the process for fabricating a subpackage by using at least one substructure will be described in detail with reference to FIG. 23 to FIG. 33. The following will describe an example where the first layered substructure 115 of FIG. 22, which includes eight substructures 110 stacked, is used to fabricate a plurality of subpackages each including eight layer portions 10.

Figure 23:
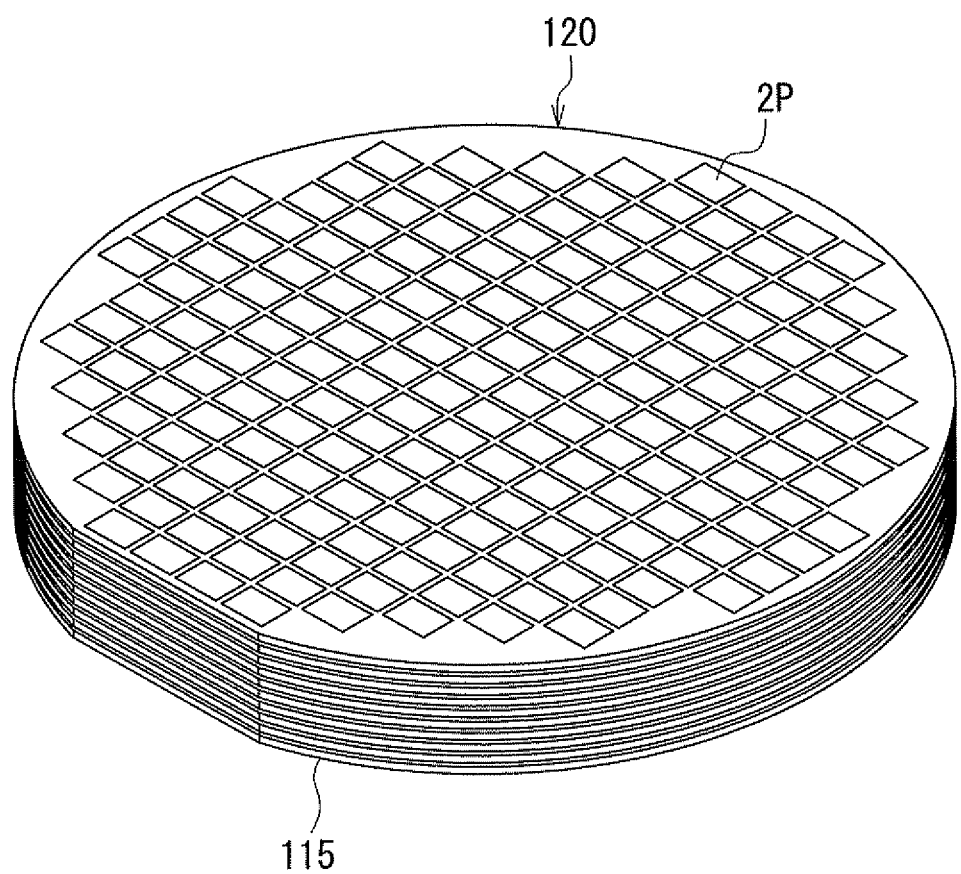
FIG. 23 is a perspective view showing a second layered substructure fabricated in a step that follows the step shown in FIG. 22.
Figure 24:
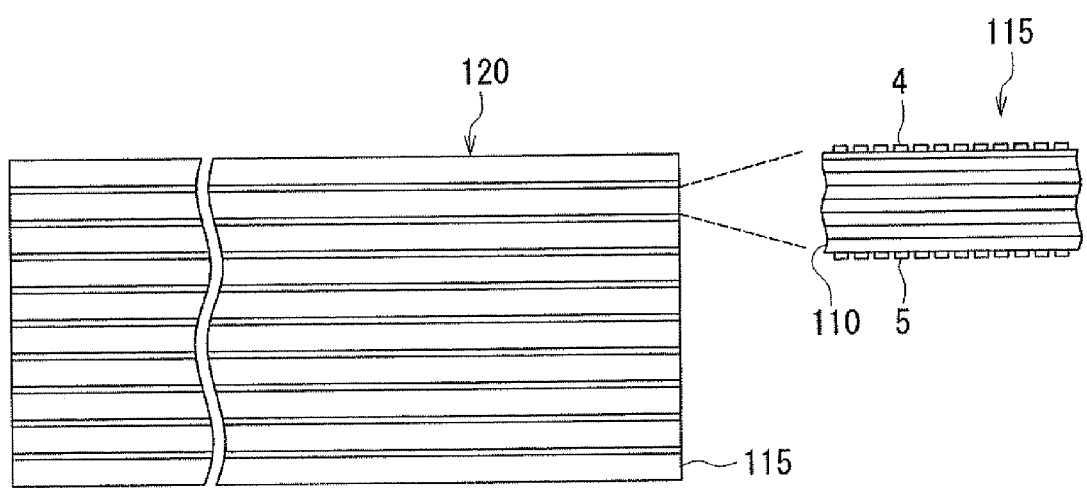
FIG. 24 is a side view of the second layered substructure shown in FIG. 23.

FIG. 23 and FIG. 24 show a step that follows the step shown in FIG. 22. In this step, a plurality of first layered substructures 115 are stacked and every two vertically adjacent first layered substructures 115 are bonded to each other, whereby a second layered substructure 120 is fabricated. FIG. 23 and FIG. 24 show an example where ten first layered substructures 115 are stacked to fabricate the second layered substructure 120. Every two vertically adjacent first layered substructures 115 are bonded to each other with an adhesive so as to be easily detachable. In this example, as shown in FIG. 24, the second layered substructure 120 includes ten first layered substructures 115 stacked, each of the first layered substructures 115 including eight substructures 110 stacked. That is, the second layered substructure 120 includes 80 substructures 110 stacked. Suppose that each individual substructure 110 has a thickness of 50 μm. Ignoring the thickness of the adhesive that bonds every two vertically adjacent substructures 110 to each other and the thickness of the adhesive that bonds every two vertically adjacent first layered substructures 115 to each other, the second layered substructure 120 has a thickness of 50 μm×80, i.e., 4 mm.

Figure 25:
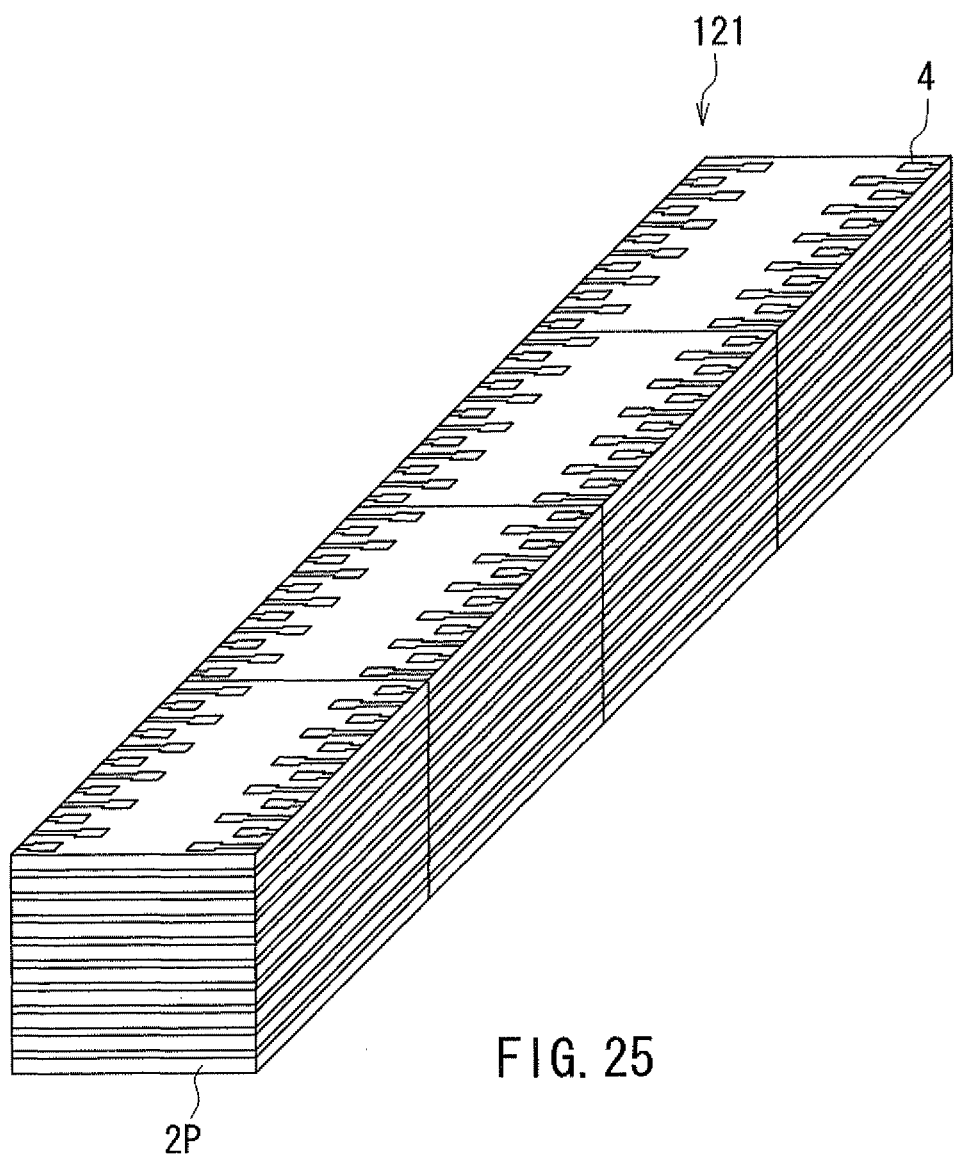
FIG. 25 is a perspective view showing an example of a block obtained by cutting the second layered substructure.

FIG. 25 shows a step that follows the step shown in FIG. 23 and FIG. 24. In this step, the second layered substructure 120 is cut into at least one block 121 in which a plurality of pre-separation main bodies 2P are arranged both in the direction of stacking of the first layered substructures 115 and in a direction orthogonal thereto. FIG. 25 shows an example of the block 121. In the block 121 shown in FIG. 25, ten pre-separation main bodies 2P are arranged in the direction of stacking of the first layered substructures 115, and four are arranged in the direction orthogonal to the direction of stacking of the first layered substructures 115. In this example, the block 121 includes 40 pre-separation main bodies 2P.

Figure 26:
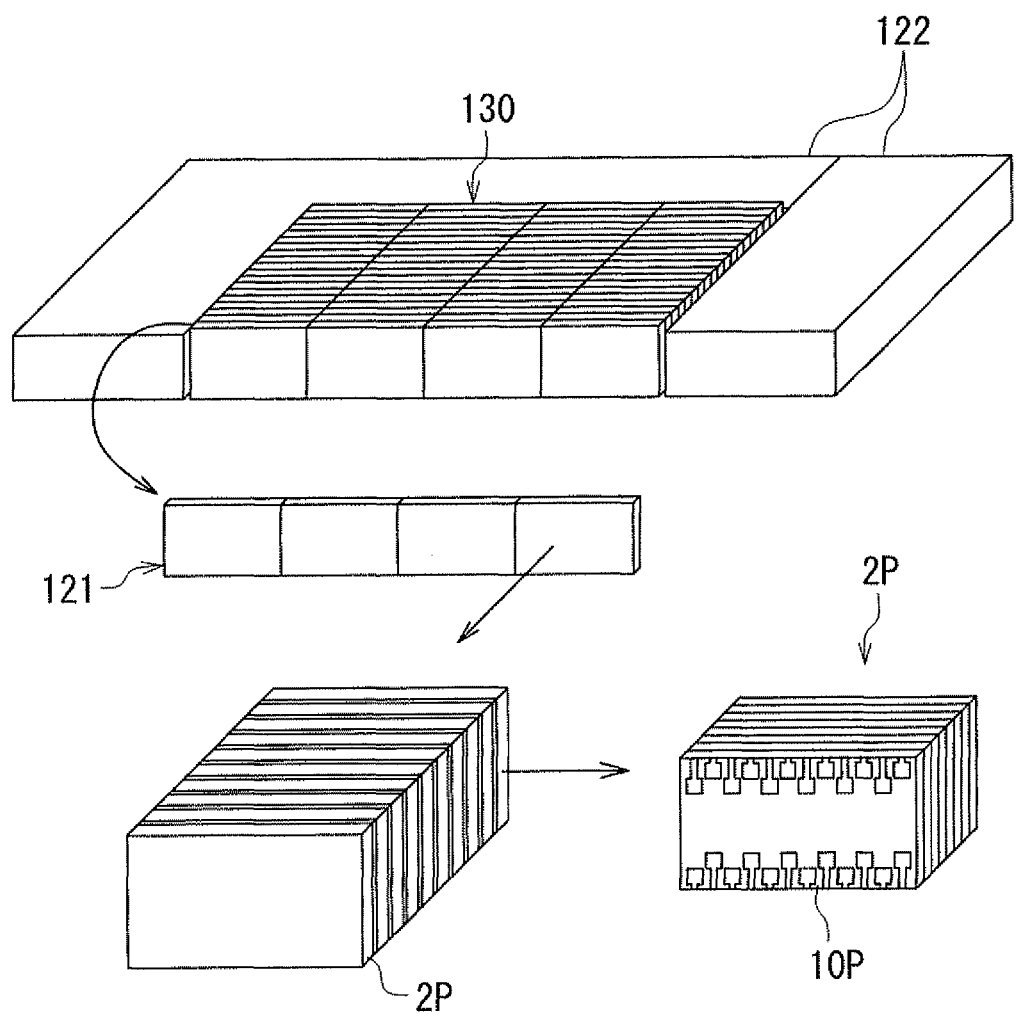
FIG. 26 is an explanatory diagram showing a step that follows the step shown in FIG. 25.

FIG. 26 shows a step that follows the step shown in FIG. 25. In this step, a plurality of jigs 122 are used to arrange two or more blocks 121 to form a block assembly 130. The plurality of jigs 122 are combined to form a frame for surrounding the block assembly 130. FIG. 26 shows an example where 19 blocks 121 shown in FIG. 25 are arranged to form the block assembly 130. In this example, the block assembly 130 includes 19 blocks 121, each of the blocks 121 includes 40 pre-separation main bodies 2P, and each of the pre-separation main bodies 2P includes 8 preliminary layer portions 10P. That is, the block assembly 130 includes 19×40, i.e., 760 pre-separation main bodies 2P, and 19×40×8, i.e., 6080 preliminary layer portions 10P. All the pre-separation main bodies 2P included in the block assembly 130 are arranged so that their respective surfaces on which the wiring 3 is to be formed later face toward the same direction, i.e., upward.

Figure 27:
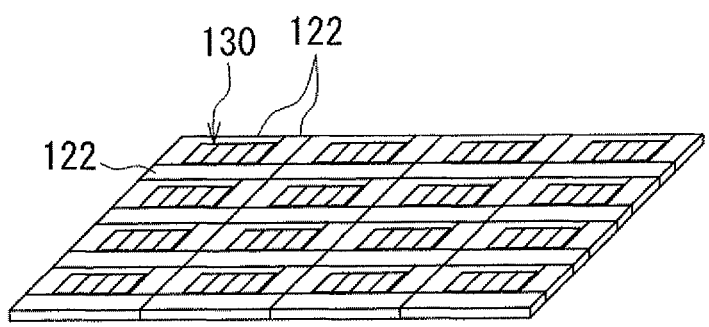
FIG. 27 is a perspective view showing a plurality of block assemblies that are arranged in a step that follows the step shown in FIG. 26.

FIG. 27 shows a step that follows the step shown in FIG. 26. In this step, a plurality of block assemblies 130 are arranged in one plane by using a plurality of jigs 122. Here, all the pre-separation main bodies 2P included in the plurality of block assemblies 130 are arranged so that their respective surfaces on which the wiring 3 is to be formed later face toward the same direction, i.e., upward. FIG. 27 shows an example where 16 block assemblies 130 are arranged in one plane. In such a case, the 16 block assemblies 130 include 760×16, i.e., 12160 pre-separation main bodies 2P, and 6080×16, i.e., 97280 preliminary layer portions 10P.

In the present embodiment, the wiring 3 is then simultaneously formed on all the pre-separation main bodies 2P that are included in the plurality of block assemblies 130 arranged as shown in FIG. 27. The step of forming the wiring 3 will be described with reference to FIG. 28 to FIG. 32.

Figure 28:
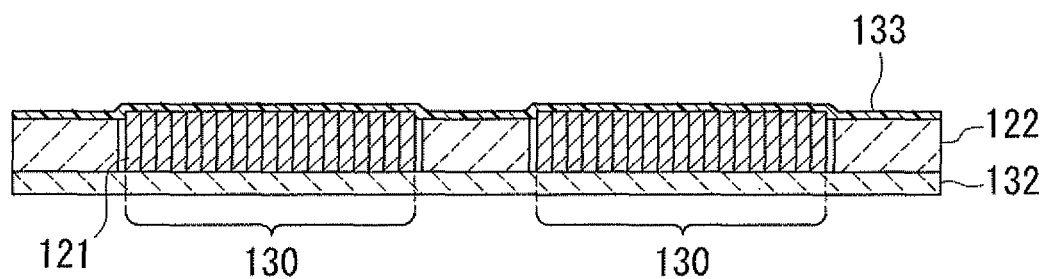
FIG. 28 is a cross-sectional view showing a step of the process for forming the wiring in the first embodiment of the invention.

In the step of forming the wiring 3, as shown in FIG. 28, the plurality of jigs 122 and the plurality of block assemblies 130 shown in FIG. 27 are placed on a flat top surface of a jig 132. The plurality of block assemblies 130 are thereby arranged in one plane. In such a state, the top surfaces of the jigs 122 are located at a level slightly lower than that of the top surfaces of the block assemblies 130.

In the step of forming the wiring 3, a resin layer 133 is then formed to cover the top surfaces of the jigs 122 and the top surfaces of the block assemblies 130. The resin layer 133 may be formed by applying an uncured resin and then curing the resin, or by using a dry film.

Figure 29:
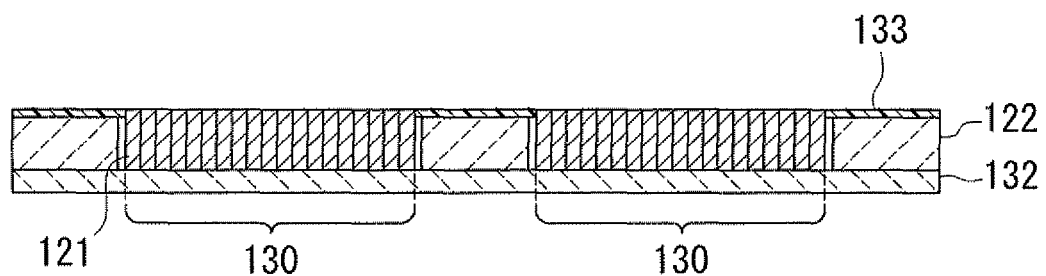
FIG. 29 is a cross-sectional view showing a step that follows the step shown in FIG. 28.

FIG. 29 shows a step that follows the step shown in FIG. 28. In this step, the resin layer 133 is polished by, for example, CMP, until the top surfaces of the plurality of block assemblies 130 are exposed. The top surfaces of the plurality of block assemblies 130 and the top surface of the resin layer 133 are thereby made even with each other.

Figure 30:
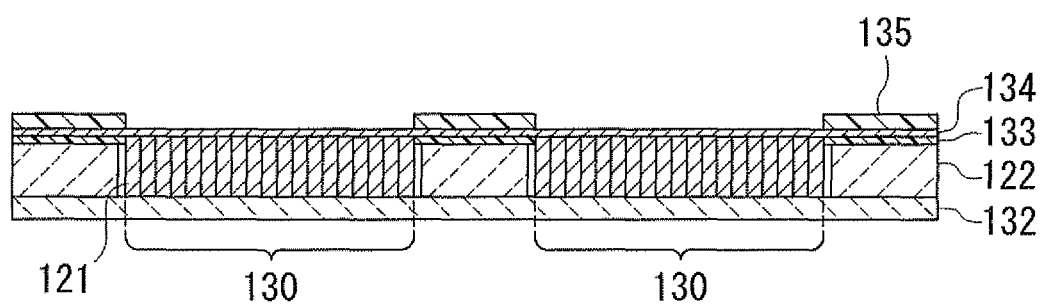
FIG. 30 is a cross-sectional view showing a step that follows the step shown in FIG. 29.

FIG. 30 shows a step that follows the step shown in FIG. 29. In this step, a seed layer 134 for plating is initially formed over the top surfaces of the plurality of block assemblies 130 and the resin layer 133. Next, a photoresist layer is formed on the seed layer 134. The photoresist layer is then patterned by photolithography to form a frame 135. The frame 135 has a plurality of openings in which a plurality of units of wiring 3 corresponding to the plurality of pre-separation main bodies 2P are to be accommodated later. Although not shown in FIG. 30, the frame 135 includes a plurality of portions located above the respective surfaces of all the pre-separation main bodies 2P included in the plurality of block assemblies 130 on which the wiring 3 is to be formed. These plurality of portions have the respective openings to accommodate the wiring 3 later.

Figure 31:
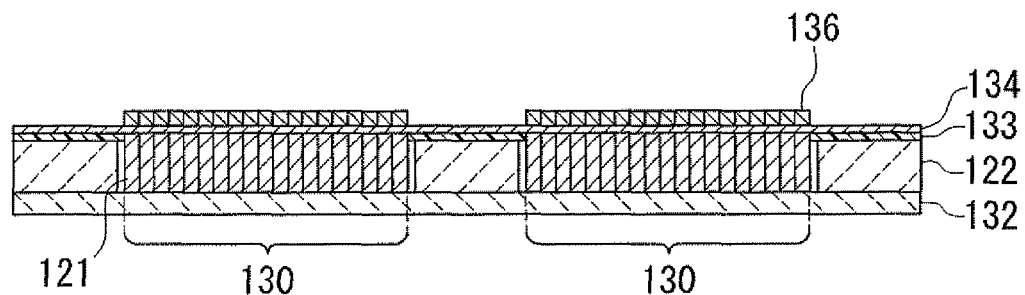
FIG. 31 is a cross-sectional view showing a step that follows the step shown in FIG. 30.

FIG. 31 shows a step that follows the step shown in FIG. 30. In this step, a plating layer 136 to constitute part of the wiring 3 is initially formed in each of the openings of the frame 135 by plating. Next, the frame 135 is removed. For the sake of convenience, FIG. 31 shows the plating layer 136 in a rectangular shape for each of the blocks 121. Actually, however, the plating layer 136 is formed in a shape corresponding to the wiring 3 for each of the pre-separation main bodies 2P.

Figure 32:
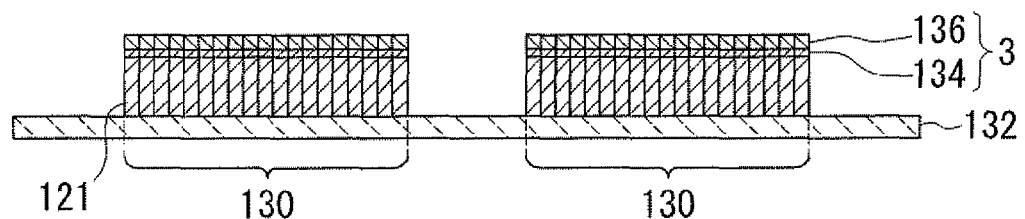
FIG. 32 is a cross-sectional view showing a step that follows the step shown in FIG. 31.

FIG. 32 shows a step that follows the step shown in FIG. 31. In this step, portions of the seed layer 134 other than those lying under the plating layers 136 are initially removed by etching. The plating layers 136 and the remaining portions of the seed layer 134 under the plating layers 136 thus form the wiring 3. The wiring 3 is formed on each of the pre-separation main bodies 2P. Next, the jigs 122 and the resin layer 133 remaining on the jigs 122 are removed.

If the wiring 3 is to be disposed on one of the side surfaces of the main body 2, the process for forming the wiring 3 is completed by the steps shown in FIG. 28 to FIG. 32. If the wiring 3 is to be disposed on two mutually opposite side surfaces of the main body 2, the process shown in FIG. 28 to FIG. 32 can be repeated twice to form the wiring 3 on the two side surfaces.

The process for fabricating a subpackage 1S then proceeds to the step of separating the plurality of pre-separation main bodies 2P from each other. Here, the pre-separation main bodies 2P each provided with the wiring 3 are separated from each other so that a plurality of subpackages 1S are formed. This step will be described with reference to FIG. 33. In the step, the block 121 is initially cut in the positions of the boundaries between every two pre-separation main bodies 2P that are adjacent to each other in the direction orthogonal to the direction of stacking of the pre-separation main bodies 2P.

Figure 33:
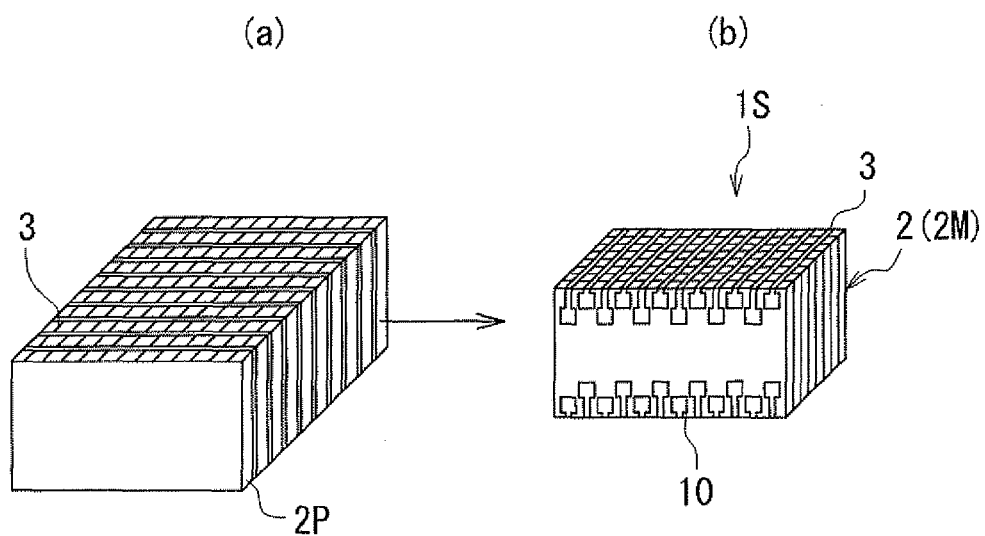
FIG. 33 is an explanatory diagram showing a step that follows the step shown in FIG. 32.

This produces a plurality of stacks shown in portion (a) of FIG. 33. Each of the stacks includes a plurality of pre-separation main bodies 2P stacked. In each of the stacks, every two adjacent pre-separation main bodies 2P are easily detachably bonded to each other by the adhesive that was used to bond every two vertically adjacent first layered substructures 115 when fabricating the second layered substructure 120 in the step shown in FIG. 23 and FIG. 24. Next, the plurality of pre-separation main bodies 2P included in the stack shown in portion (a) of FIG. 33 are separated from each other. This makes the pre-separation main bodies 2P into main bodies 2, whereby a plurality of subpackages 1S, each of which includes the main body 2 and the wiring 3, are formed. Portion (b) of FIG. 33 shows one of the subpackages 1S.

A plurality of subpackages 1S are thus formed through the series of steps that have been described with reference to FIG. 8 to FIG. 33. So far the description has dealt with the case where a plurality of subpackages (layered chip packages) 1S each including eight layer portions 10 are formed by using the first layered substructure 115 that includes eight stacked substructures 110 shown in FIG. 22. In the present embodiment, however, the number of the substructures 110 to be included in the first layered substructure 115 can be changed to form a plurality of types of subpackages (layered chip packages) 1S with different numbers of layer portions 10. Moreover, in the present embodiment, a structure composed of a single substructure 110 and a plurality of terminals 5 formed on its the bottom surface may be fabricated instead of the first layered substructure 115, and such a structure may be used instead of the first layered substructure 115 to form a plurality of subpackages 1S through the series of steps described with reference to FIG. 23 to FIG. 33. In this case, each of the subpackages 1S includes only a single layer portion 10.

Figure 34:
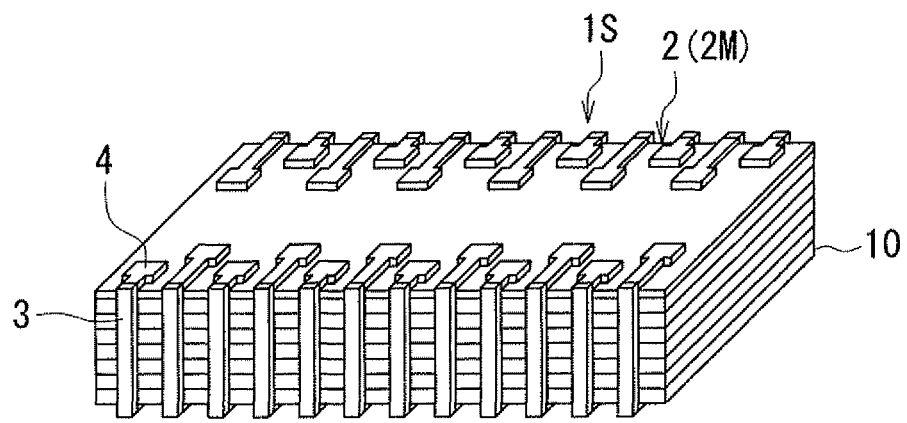
FIG. 34 is a perspective view showing a subpackage that includes eight layer portions.
Figure 35:
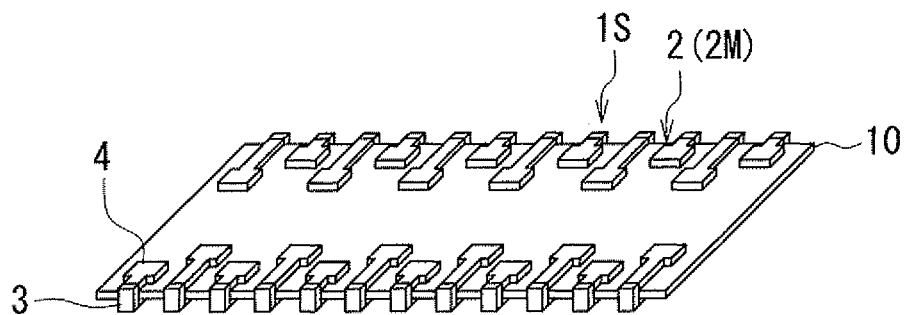
FIG. 35 is a perspective view showing a subpackage that includes only a single layer portion.
Figure 36:
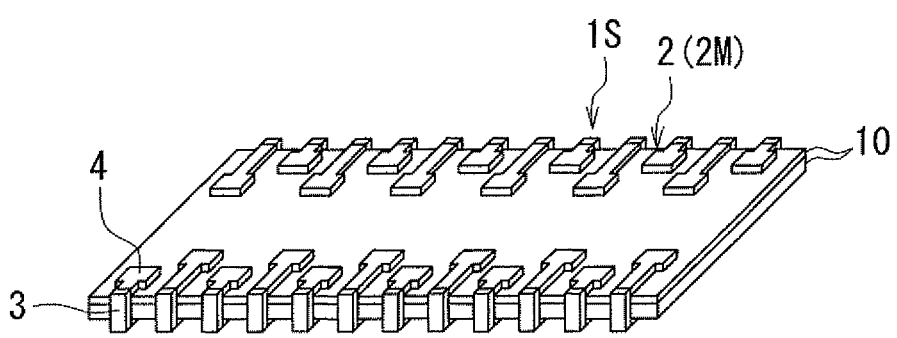
FIG. 36 is a perspective view showing a subpackage that includes two layer portions.
Figure 37:
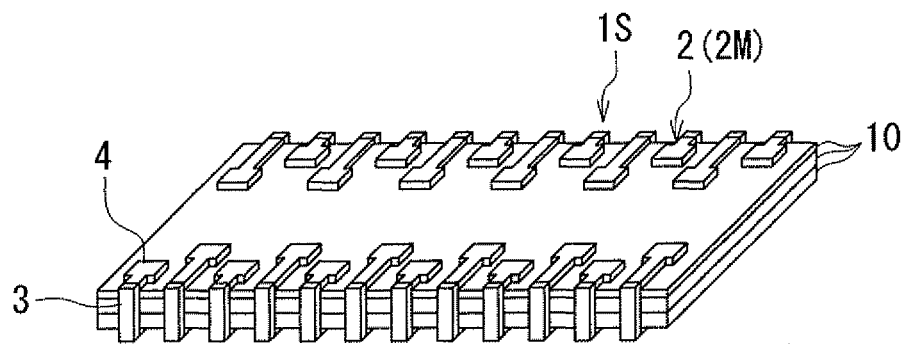
FIG. 37 is a perspective view showing a subpackage that includes three layer portions.
Figure 38:
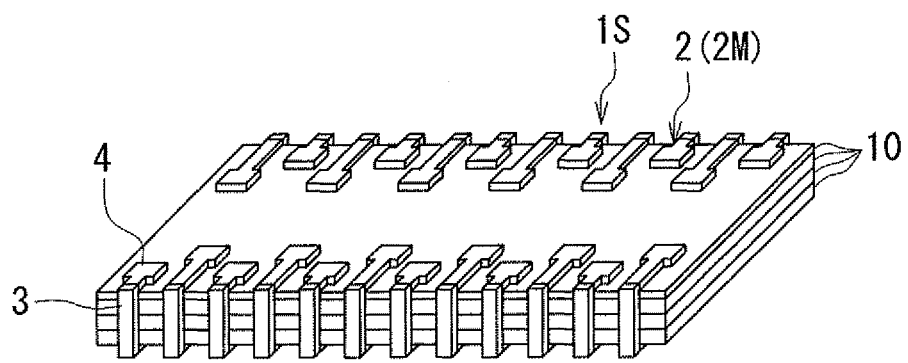
FIG. 38 is a perspective view showing a subpackage that includes four layer portions.

FIG. 34 to FIG. 38 show examples of a plurality of types of subpackages 1S having different numbers of layer portions 10 that can be fabricated according to the present embodiment. FIG. 34 shows a subpackage 1S that includes eight layer portions 10. FIG. 35 shows a subpackage 1S that includes only a single layer portion 10. FIG. 36 shows a subpackage 1S that includes two layer portions 10. FIG. 37 shows a subpackage 1S that includes three layer portions 10. FIG. 38 shows a subpackage 1S that includes four layer portions 10.

The subpackage 1S of the present embodiment has the wiring 3 disposed on at least one of the side surfaces of the main body 2. The main body 2 has the plurality of first terminals 4 disposed on the top surface 2Ma of the main part 2M. For any two vertically adjacent subpackages 1S, the main body 2 of at least the upper subpackage 1S further includes the plurality of second terminals 5 disposed on the bottom surface 2Mb of the main part 2M. Both the first terminals 4 and the second terminals 5 are electrically connected to the wiring 3. With the subpackage 1S of such a configuration, the first terminals 4 of one subpackage 1S can be used to electrically connect the subpackage 1S with another subpackage 1S. For example, according to the present embodiment, it is possible to establish electrical connection between two or more subpackages 1S by stacking the two or more subpackages 1S on each other and electrically connecting the second terminals 5 of the upper one of two adjacent subpackages 1S to the first terminals 4 of the lower one of the two adjacent subpackages 1S.

According to the present embodiment, a plurality of subpackages 1S can be mounted on a wiring board and electrical connection between the plurality of subpackages 1S can be established by using the wiring of the wiring board and the second terminals 5 of the plurality of subpackages 1S. In such a case, the first terminals 4 of one of the subpackages 1S can be electrically connected to those of another one of the subpackages 1S by wire bonding, for example.

Figure 39:
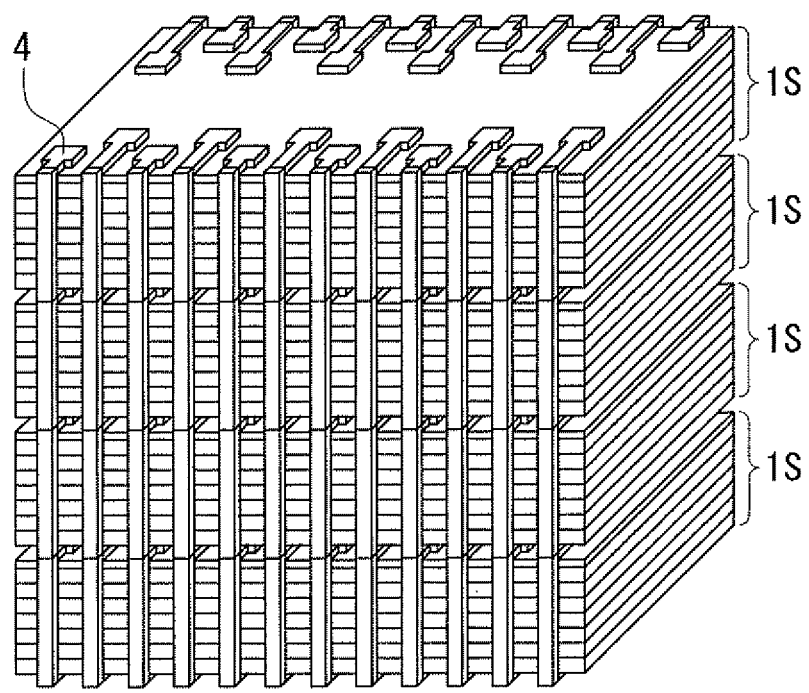
FIG. 39 is a perspective view showing four subpackages stacked.

According to the present embodiment, it is possible to stack three or more subpackages 1S and establish electrical connection therebetween. FIG. 39 shows an example where four subpackages 1S are stacked and electrically connected to each other.

Figure 40:
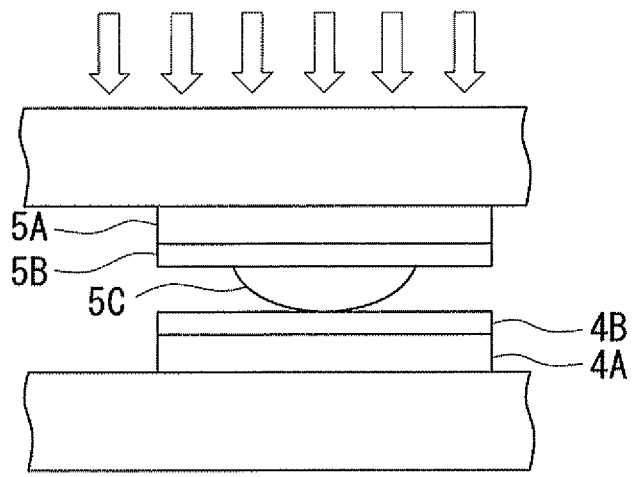
FIG. 40 is a side view showing connecting parts of the terminals of two vertically adjacent subpackages.
Figure 41:
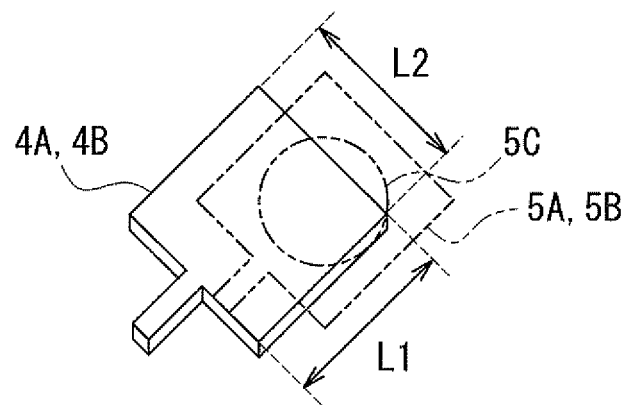
FIG. 41 is an explanatory diagram for explaining misalignment between the terminals of two vertically adjacent subpackages.

Moreover, the present embodiment facilitates the alignment between every two vertically adjacent subpackages 1S when stacking a plurality of subpackages 1S. This advantageous effect will now be described with reference to FIG. 40 and FIG. 41. FIG. 40 is a side view showing connecting parts of the terminals of two vertically adjacent subpackages 1S. FIG. 41 is an explanatory diagram for explaining misalignment between the terminals of two vertically adjacent subpackages 1S.

In the example shown in FIG. 40 and FIG. 41, the terminal 4 includes a conductor pad 4A of rectangular shape and an Au layer 4B that is formed on the surface of the conductor pad 4A. The conductor pad 4A constitutes a part of the electrode 32, and is made of Cu, for example. The terminal 5 includes a conductor pad 5A of rectangular shape, an underlayer 5B formed on the surface of the conductor pad 5A, and a solder layer 5C formed on the surface of the underlayer 5B. For example, the conductor pad 5A is made of Cu, the underlayer 5B is made of Au, and the solder layer 5C is made of AuSn. Alternatively, contrary to this example, it is possible that the terminal 4 includes a conductor pad, an underlayer and a solder layer, while the terminal 5 includes a conductor pad and an Au layer. Both of the terminals 4 and 5 may include a solder layer. Here, the lengths of two orthogonal sides of the conductor pad 4A will be represented by L1 and L2. L1 and L2 are both 40 to 80 µm, for example. The conductor pad 5A has the same shape as that of the conductor pad 4A.

In the example shown in FIG. 40, the corresponding terminals 4 and 5 of the two vertically adjacent subpackages 1S are electrically connected in the following way. The Au layer 4B and the solder layer 5C of the corresponding terminals 4 and 5 are put into contact with each other. By applying heat and pressure, the solder layer 5C is melted, and then solidified to bond the terminals 4 and 5 to each other.

FIG. 41 shows a state where the terminals 4 and 5 are out of alignment. The state where the terminals 4 and 5 are out of alignment refers to the state where the edges of the conductor pad 4A and those of the conductor pad 5A do not coincide in position with each other when viewed in a direction perpendicular to the plane of the conductor pads 4A and 5A. In the present embodiment, the corresponding terminals 4 and 5 may be out of alignment as long as the terminals 4 and 5 can be bonded with a sufficiently small resistance at the interface between the terminals 4 and 5. Assuming that L1 and L2 are 30 to 60 µm, the maximum permissible misalignment between the terminals 4 and 5 is smaller than L1 and L2 yet several tens of micrometers.

According to the present embodiment, some misalignment between the terminals 4 and 5 is thus acceptable when stacking a plurality of subpackages 1S. This facilitates the alignment between two vertically adjacent subpackages 1S. Consequently, according to the present embodiment, it is possible to reduce the manufacturing cost of an electronic component (including the composite layered chip package 1 according to the embodiment) that includes a plurality of subpackages 1S stacked.

Figure 42:
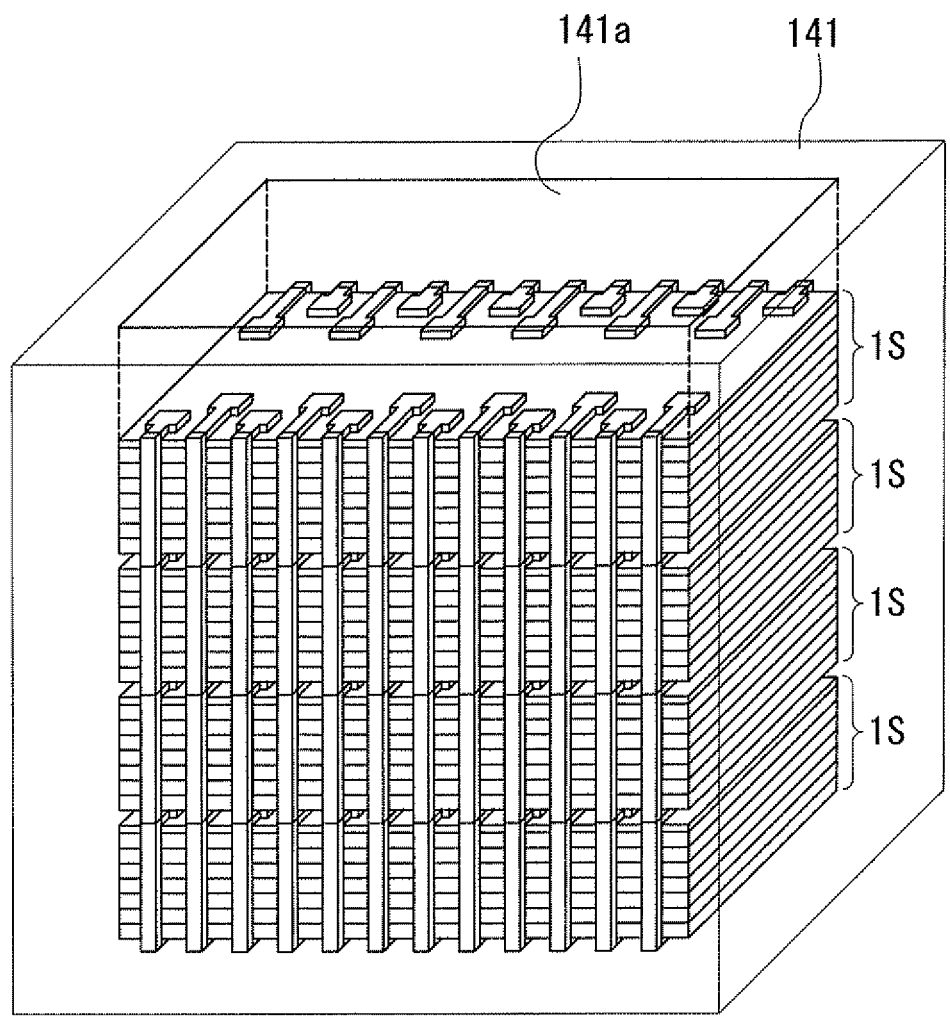
FIG. 42 is a perspective view showing an example of a method of manufacturing an electronic component that includes a plurality of subpackages stacked.

FIG. 42 shows an example of a method of manufacturing an electronic component that includes a plurality of subpackages 1S stacked. The method shown in FIG. 42 uses a heat-proof container 141. The container 141 has an accommodating part 141a in which a plurality of subpackages 1S can be stacked and accommodated. The accommodating part 141a has such a size that the side surfaces of the subpackages 1S accommodated in the accommodating part 141a and the inner walls of the accommodating part 141a leave a slight gap therebetween. In the method, a plurality of subpackages 1S are stacked and accommodated in the accommodating part 141a of the container 141, and then the container 141 and the plurality of subpackages 1S are heated at temperatures at which the solder layer melts (for example, 320° C.). This melts the solder layer, whereby the terminals 4 and 5 of every two vertically adjacent subpackages 1S are bonded to each other. According to the method, a plurality of subpackages 1S are stacked and accommodated in the accommodating part 141a of the container 141, whereby the plurality of subpackages 1S can be easily aligned with each other. This makes it easy to manufacture an electronic component that includes a plurality of subpackages 1S stacked.

The composite layered chip package 1 according to the present embodiment includes a plurality of subpackages 1S stacked. For any two vertically adjacent subpackages 1S of the composite layered package 1, the plurality of second terminals 5 of the upper subpackage 1S are electrically connected to the plurality of first terminals 4 of the lower subpackage 1S. The main part 2M of the main body 2 of each of the plurality of subpackages 1S includes at least one first-type layer portion 10A. The main part 2M of the main body 2 of at least one of the plurality of subpackages 1S further includes at least one second-type layer portion 10B.

The first-type layer portion 10A includes a conforming semiconductor chip 30. The first-type layer portion 10A includes a first-type insulating layer 106A and a plurality of first-type electrodes 32A. The first-type insulating layer 106A has a plurality of openings 106a for exposing a plurality of electrode pads 34 of the semiconductor chip 30. The plurality of first-type electrodes 32A are electrically connected to the semiconductor chip 30 and to the wiring 3. The plurality of first-type electrodes 32A are electrically connected to the plurality of electrode pads 34 of the semiconductor chip 30 through the plurality of openings 106A of the first-type insulating layer 106A. The conforming semiconductor chip 30 in the first-type layer portion 10A is thus electrically connected to the wiring 3 through the plurality of first-type electrodes 32A.

The second-type layer portion 10B includes a defective semiconductor chip 30. The second-type layer portion 10B includes a second-type insulating layer 106B and a plurality of second-type electrodes 32B. The second-type insulating layer 106B covers the plurality of electrode pads 34 of the semiconductor chip 30 so as to avoid exposure. The plurality of second-type electrodes 32B are electrically connected to the wiring 3 and not to the semiconductor chip 30. The defective semiconductor chip 30 in the second-type layer portion 10B is not electrically connected to the wiring 3.

The method of manufacturing the composite layered chip package 1 according to the present embodiment includes the steps of: fabricating a plurality of subpackages 1S; and stacking the plurality of subpackages 1S and, for any two vertically adjacent subpackages 1S, electrically connecting the plurality of second terminals 5 of the upper subpackage 1S to the plurality of first terminals 4 of the lower subpackage 1S.

The step of fabricating a plurality of subpackages 1S includes, as a series of steps for forming each of the subpackages 1S, the steps of: fabricating at least one substructure 110 that includes an array of a plurality of preliminary layer portions 10P, each of the preliminary layer portions 10P being intended to become any one of the layer portions 10 included in the main part 2M, the substructure 110 being intended to be cut later at the positions of the boundaries between every adjacent preliminary layer portions 10P; and forming the subpackage 1S from the at least one substructure 110. The step of fabricating the at least one substructure 110 includes the steps of fabricating a pre-substructure wafer 101 that includes an array of a plurality of pre-semiconductor-chip portions 30P, the pre-semiconductor-chip portions 30P being intended to become the semiconductor chips 30, respectively; and distinguishing the plurality of pre-semiconductor-chip portions 30P included in the pre-substructure wafer 101 into normally functioning pre-semiconductor-chip portions 30P and malfunctioning pre-semiconductor-chip portions 30P. The step of fabricating the at least one substructure 110 further includes the step of forming the first-type insulating layer 106A and the first-type electrodes 32A in the normally functioning pre-semiconductor-chip portions 30P while forming the second-type insulating layer 106B and the second-type electrodes 32B in the malfunctioning pre-semiconductor-chip portions 30P, so that the pre-substructure wafer 101 is made into the substructure 110.

According to the present embodiment, by stacking a plurality of subpackages 1S, it is possible to easily implement a package that includes a plurality of semiconductor chips 30 stacked and that is capable of providing, even if it includes a defective semiconductor chip 30, the same functions as those for the case where no defective semiconductor chip 30 is included. This advantageous effect will now be described in detail.

By way of example, a description will be given of a case where a layered chip package that includes eight conforming semiconductor chips 30 is required. In this case, if there is fabricated a layered chip package including only eight semiconductor chips 30 and if one or more of the eight semiconductor chips 30 are defective, simply disabling the defective semiconductor chip(s) 30 cannot make the layered chip package meet the above requirement. The defective semiconductor chip(s) 30 can be replaced with conforming semiconductor chip(s) 30 to remake the layered chip package, but this raises the manufacturing cost for the layered chip package.

According to the present embodiment, if, for example, a first subpackage 1S includes eight semiconductor chips 30 and one or more of the eight semiconductor chips 30 are defective, a second subpackage 1S having as many conforming semiconductor chip(s) 30 as the foregoing defective semiconductor chip(s) 30 can be stacked with the first subpackage 1S to form a composite layered chip package 1. The resulting composite layered chip package 1 provides the same functions as those of a layered chip package that includes eight conforming semiconductor chips 30 and no defective semiconductor chip 30.

For example, in the composite layered chip package 1 shown in FIG. 1 to FIG. 5, the subpackage 1A includes six first-type layer portions 10A and two second-type layer portions 10B, while the subpackage 1B includes two first-type layer portions 10A. The composite layered chip package 1 thus includes eight first-type layer portions 10A and two second-type layer portions 10B. The two defective semiconductor chips 30 included in the two second-type layer portions 10B are not electrically connected to the wiring 3, and are thus disabled. The composite layered chip package 1 shown in FIG. 1 to FIG. 5 therefore provides the same functions as those of a layered chip package that includes eight conforming semiconductor chips 30 stacked and no defective semiconductor chip 30.

As previously described, according to the present embodiment, a plurality of subpackages 1S can be easily stacked and electrically connected to each other. Consequently, according to the present embodiment, a composite layered chip package 1 including a plurality of semiconductor chips 30 stacked can be easily implemented by stacking a plurality of subpackages 1S, the composite layered chip package 1 being capable of providing, even if it includes a defective semiconductor chip 30, the same functions as those for the case where no defective semiconductor chip 30 is included.

Figure 43:
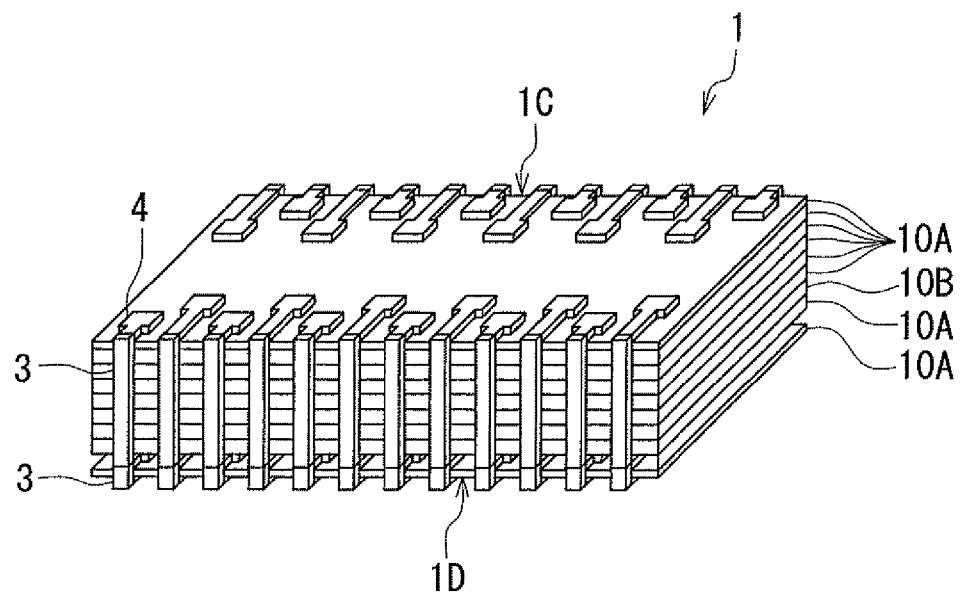
FIG. 43 is a perspective view showing a first modification example of the composite layered chip package of the first embodiment of the invention.
Figure 44:
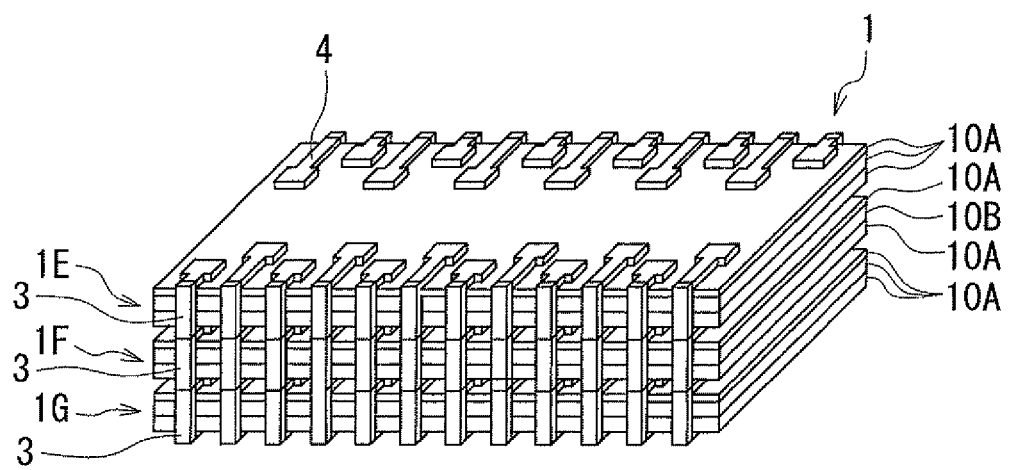
FIG. 44 is perspective view showing a second modification example of the composite layered chip package of the first embodiment of the invention.

In the present embodiment, a composite layered chip package 1 including a required number of conforming semiconductor chips 30 can be formed by combining a plurality of subpackages 1S in various configurations. FIG. 43 and FIG. 44 show examples where a composite layered chip package 1 including eight conforming semiconductor chips 30 is formed by combining a plurality of subpackages 1S in different configurations from the configuration of the example of FIG. 1 to FIG. 5.

The composite layered chip package 1 shown in FIG. 43 includes two subpackages 1C and 1D that are stacked and electrically connected to each other. The subpackage 1C includes seven first-type layer portions 10A and a single second-type layer portion 10B. The subpackage 1D includes only a single first-type layer portion 10A. This composite layered chip package 1 thus includes eight first-type layer portions 10A and a single second-type layer portions 10B.

The composite layered chip package 1 shown in FIG. 44 includes three subpackages 1E, 1F, and 1G that are stacked and electrically connected to each other. The subpackage 1E includes three first-type layer portions 10A. The subpackage 1F includes two first-type layer portions 10A and a single second-type layer portion 10B. The subpackage 1G includes three first-type layer portions 10A. This composite layered chip package 1 thus includes eight first-type layer portions 10A and a single second-type layer portion 10B.

Both the composite layered chip package 1 shown in FIG. 43 and that shown in FIG. 44 provide the same functions as those of a layered chip package that includes eight conforming semiconductor chips 30 stacked and no defective semiconductor chip 30.

Although not shown in the drawings, there are many configurations that can form a composite layered chip package 1 having eight conforming semiconductor chips 30, aside from the illustrated configurations.

Suppose, in the present embodiment, that the plurality of semiconductor chips 30 included in the composite layered chip package 1 are memory chips with a capacity of N bits each (N is a natural number). Suppose also that the number of the first-type layer portions 10A included in the composite layered chip package 1, i.e., the number of conforming semiconductor chips 30 included in the composite layered chip package 1, is eight. In such a case, the composite layered chip package 1 can implement a memory of N bytes in capacity. Here, it is easy to recognize the capacities of the memory chips and the capacity of the memory to be implemented by the composite layered chip package 1. This advantageous effect is also obtainable when the number of the first-type layer portions 10A included in the composite layered chip package 1 is a multiple of 8.

In the present embodiment, as previously described, defective semiconductor chips 30 are not electrically connected to the wiring 3. The defective semiconductor chips 30 may thus be regarded as a mere insulating layer. Consequently, according to the present embodiment, it is possible to disable the defective semiconductor chips 30 and to prevent the defective semiconductor chips 30 from causing malfunction of the layered chip package.

In the present embodiment, in a single subpackage 1S, the plurality of first terminals 4 are formed by using the plurality of electrodes 32, i.e., the plurality of first-type electrodes 32A or second-type electrodes 32B, of the uppermost layer portion 10. In the present embodiment, the second-type layer portion 10B which includes a defective semiconductor chip 30 has the plurality of second-type electrodes 32B which are electrically connected to the wiring 3 and not to the semiconductor chip 30. Consequently, according to the present embodiment, even if the second-type layer portion 10B is the uppermost in a single subpackage 1S, the plurality of second-type electrodes 32B can be used to form the plurality of first terminals 4. Therefore, according to the present embodiment, even if the second-type layer portion 10B is the uppermost in a single subpackage 1S, it is possible to stack another subpackage 1S on the subpackage 1S and electrically connect the two subpackages 1S to each other. That is, the second-type electrodes 32B do not have the function of electrically connecting the semiconductor chip 30 to the wiring 3 but have an interposer function of electrically connecting two subpackages 1S to each other.

According to the present embodiment, in a layered chip package, i.e., a subpackage 1S including a plurality of semiconductor chips 30 stacked, the stacked semiconductor chips 30 are electrically connected to each other by the wiring 3 which is disposed on at least one of the side surfaces of the main body 2. Consequently, the present embodiment is free from the problems of the wire bonding method, that is, the problem that it is difficult to reduce the distance between the electrodes so as to avoid contact between the wires, and the problem that the high resistances of the wires hamper quick circuit operation.

As compared with the through electrode method, the present embodiment has the following advantages. First, the present embodiment does not require the formation of through electrodes in each chip and consequently does not require a large number of steps for forming through electrodes in each chip.

According to the present embodiment, electrical connection between the plurality of semiconductor chips 30 is established by the wiring 3 disposed on at least one of the side surfaces of the main body 2. The present embodiment thus provides higher reliability of electrical connection between chips as compared with the case where through electrodes are used to establish electrical connection between the chips.

Furthermore, according to the present embodiment, it is possible to easily change the line width and thickness of the wiring 3. Consequently, it is possible to easily cope with future demands for finer wiring 3.

The through electrode method requires that the through electrodes of vertically adjacent chips be connected to each other by means of, for example, soldering at high temperatures. In contrast, according to the present embodiment, it is possible to form the wiring 3 at lower temperatures since the wiring 3 can be formed by plating. According to the present embodiment, it is also possible to bond the plurality of layer portions 10 to each other at low temperatures. Consequently, it is possible to prevent the chips 30 from suffering damage from heat.

The through electrode method further requires accurate alignment between vertically adjacent chips in order to connect the through electrodes of the vertically adjacent chips to each other. In contrast, according to the present embodiment, electrical connection between a plurality of semiconductor chips 30 is established not at an interface between two vertically adjacent layer portions 10 but through the use of the wiring 3 disposed on at least one of the side surfaces of the main body 2. The alignment between a plurality of layer portions 10 therefore requires lower accuracy than that required for the alignment between a plurality of chips in the through electrode method.

In the present embodiment, the method of manufacturing a subpackage 1S including a plurality of semiconductor chips 30 stacked, i.e., the method of manufacturing a layered chip package, includes the steps of fabricating a plurality of substructures 110; fabricating a plurality of first layered substructures 115 by using the plurality of substructures 110, each of the plurality of first layered substructures 115 including a plurality of substructures 110 stacked; and forming a plurality of layered chip packages from the plurality of first layered substructures 115. Each of the first layered substructures 115 includes an array of a plurality of pre-separation main bodies 2P. The plurality of pre-separation main bodies 2P are to be separated from each other into individual main bodies 2 later.

The step of forming a plurality of layered chip packages includes the steps of fabricating a second layered substructure 120 by stacking the plurality of first layered substructures 115 and bonding every two adjacent first layered substructures 115 to each other; cutting the second layered substructure 120 into at least one block 121 that includes a plurality of pre-separation main bodies 2P arranged both in the direction of stacking of the first layered substructures 115 and in a direction orthogonal thereto; forming the wiring 3 on the plurality of pre-separation main bodies 2P included in the at least one block 121 simultaneously; and separating the plurality of pre-separation main bodies 2P each provided with the wiring 3 from each other so as to form the plurality of layered chip packages.

Such a manufacturing method for the layered chip packages makes it possible to simultaneously form a plurality of sets of the terminals 4 and 5 corresponding to the plurality of layered chip packages in the step of fabricating the first layered substructures 115. Moreover, according to the manufacturing method, the wiring 3 is formed simultaneously on the plurality of pre-separation main bodies 2P included in one or more blocks 121. This makes it possible to form a plurality of units of wiring 3 corresponding to the plurality of layered chip packages simultaneously. Here, it is unnecessary to perform alignment between the plurality of pre-separation main bodies 2P included in each block 121. Consequently, according to the manufacturing method, it is possible to mass-produce the layered chip packages that are capable of being electrically connected to each other easily, at low cost in a short time.

In the step of forming the wiring 3 in the foregoing manufacturing method, two or more blocks 121 may be arranged such that all the pre-separation main bodies 2P included in the two or more blocks 121 are directed with their surfaces for the wiring 3 to be formed on toward the same direction. Then, the wiring 3 may be formed simultaneously on all the pre-separation main bodies 2P included in the two or more blocks 121. This makes it possible to simultaneously form the wiring 3 for a larger number of pre-separation main bodies 2P.

The foregoing method of manufacturing the layered chip packages allows a reduction in the number of steps and consequently allows a reduction in cost for the layered chip packages, as compared with the manufacturing method for a layered chip package disclosed in U.S. Pat. No. 5,953,588.

According to the method of manufacturing the layered chip packages of the present embodiment, the first layered substructure 115 is fabricated by the method described with reference to FIG. 19 to FIG. 22. This makes it possible to easily reduce the thickness of a plurality of substructures 110 that constitute the first layered substructure 115 while preventing damage to the substructures 110. The present embodiment thus allows a high-yield manufacture of the layered chip packages that achieve a smaller size and higher integration.

In the present embodiment, the first layered substructure 115 can be fabricated by a method other than that described with reference to FIG. 19 to FIG. 22. For example, the first layered substructure 115 may be fabricated by bonding two pre-polishing substructures 109 to each other with their respective first surfaces 109a arranged to face each other, polishing the two second surfaces 109b of the two pre-polishing substructures 109 to fabricate a stack including two substructures 110, and laminating a plurality of such stacks. Alternatively, the first layered substructure 115 may be fabricated by bonding two substructures 110 to each other with their respective second surfaces 110b arranged to face each other to thereby fabricate a stack including the two substructures 110, and laminating a plurality of such stacks.

Second Embodiment

A second embodiment of the invention will now be described. FIG. 45 is an exploded perspective view of the composite layered chip package according to the present embodiment. FIG. 46 is a perspective view showing the composite layered chip package of FIG. 45 as viewed from below. The composite layered chip package according to the present embodiment includes wiring 3, electrodes 32, and terminals 4 and 5 of different configurations from those in the first embodiment.

The wiring 3 of the present embodiment includes a plurality of wires 3a that are disposed on at least one of the side surfaces of the main body 2. In the example shown in FIG. 45 and FIG. 46, a number of wires 3a are disposed on each of two side surfaces 2c and 2d of the main body 2. The electrodes 32 of the present embodiment each have two branched parts. The end faces of the two branched parts are exposed in the side surface 2c or 2d. Each of the wires 3a is sandwiched between and in contact with the two branched parts of an electrode 32. The first terminals 4 which are formed by using the electrodes 32 of the uppermost layer portion 10 have the same shape as that of the electrodes 32. In the present embodiment, the second terminals 5 also have the same shape as that of the electrodes 32.

Figure 47:
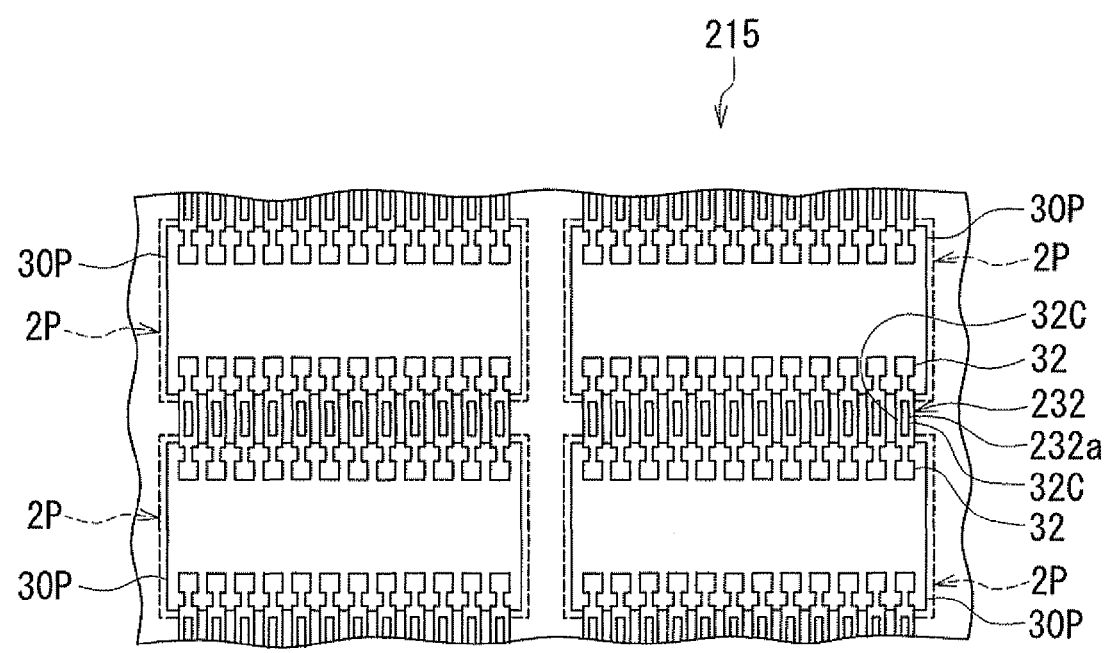
FIG. 47 is a plan view showing a part of a layered substructure fabricated in a step of a method of manufacturing the composite layered chip package according to the second embodiment of the invention.
Figure 48:
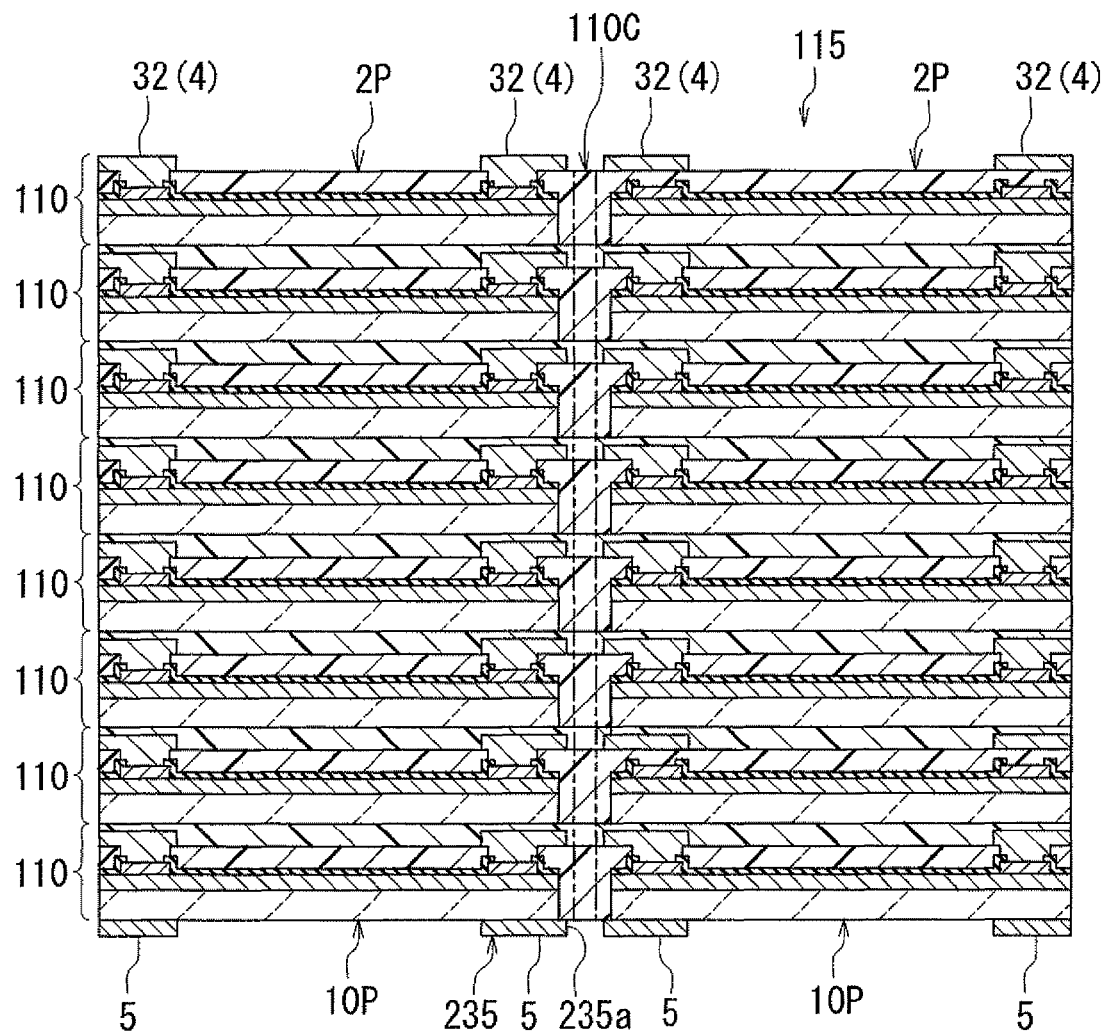
FIG. 48 is a cross-sectional view of the part of the layered substructure shown in FIG. 47.

A method of manufacturing the composite layered chip package according to the present embodiment will now be described with reference to FIG. 47 to FIG. 52. In the method of manufacturing the composite layered chip package according to the embodiment, a plurality of substructures 110 are initially stacked to fabricate a layered substructure 215. The step of fabricating the layered substructure 215 is the same as the step of forming the first layered substructure 115 of the first embodiment except that the electrodes 32 and the terminals 4 and 5 have different shapes. The layered substructure 215 of the present embodiment corresponds to the first layered substructure 115 of the first embodiment. FIG. 47 is a plan view showing a part of the layered substructure 215 of the present embodiment. FIG. 48 is a cross-sectional view of the part of the layered substructure 215 shown in FIG. 47.

As mentioned above, the electrodes 32 of the present embodiment each have two branched parts. In the present embodiment, each of the plurality of substructures 110 that constitute the layered substructure 215 includes two sets of electrodes 32 that are aligned along two mutually-opposed sides of two adjacent pre-semiconductor-chip portions 30P.

The two sets of electrodes 32 are connected to each other on a one-to-one basis. Specifically, in a pair of electrodes 32, the two branched parts of one of the electrodes 32 are connected to those of the other by two connecting portions 32C. The pair of electrodes 32 and the two connecting portions 32C are respective different parts of a single conductor layer 232. The conductor layer 232 has an opening 232a that is surrounded by the pair of electrodes 32 and the two connecting portions 32C.

In the layered substructure 215, the plurality of second terminals 5 have the same configuration as the plurality of electrodes 32 describe above. That is, two sets of terminals 5 that are aligned along two mutually-opposed sides of two adjacent pre-semiconductor-chip portions 30P are connected to each other on a one-to-one basis. Specifically, in a pair of terminals 5, the two branched parts of one of the terminals 5 are connected to those of the other by two connecting portions. The pair of terminals 5 and the two connecting portions are respective different parts of a single conductor layer 235. The conductor layer 235 has an opening 235a that is surrounded by the pair of terminals 5 and the two connecting portions.

Figure 49:
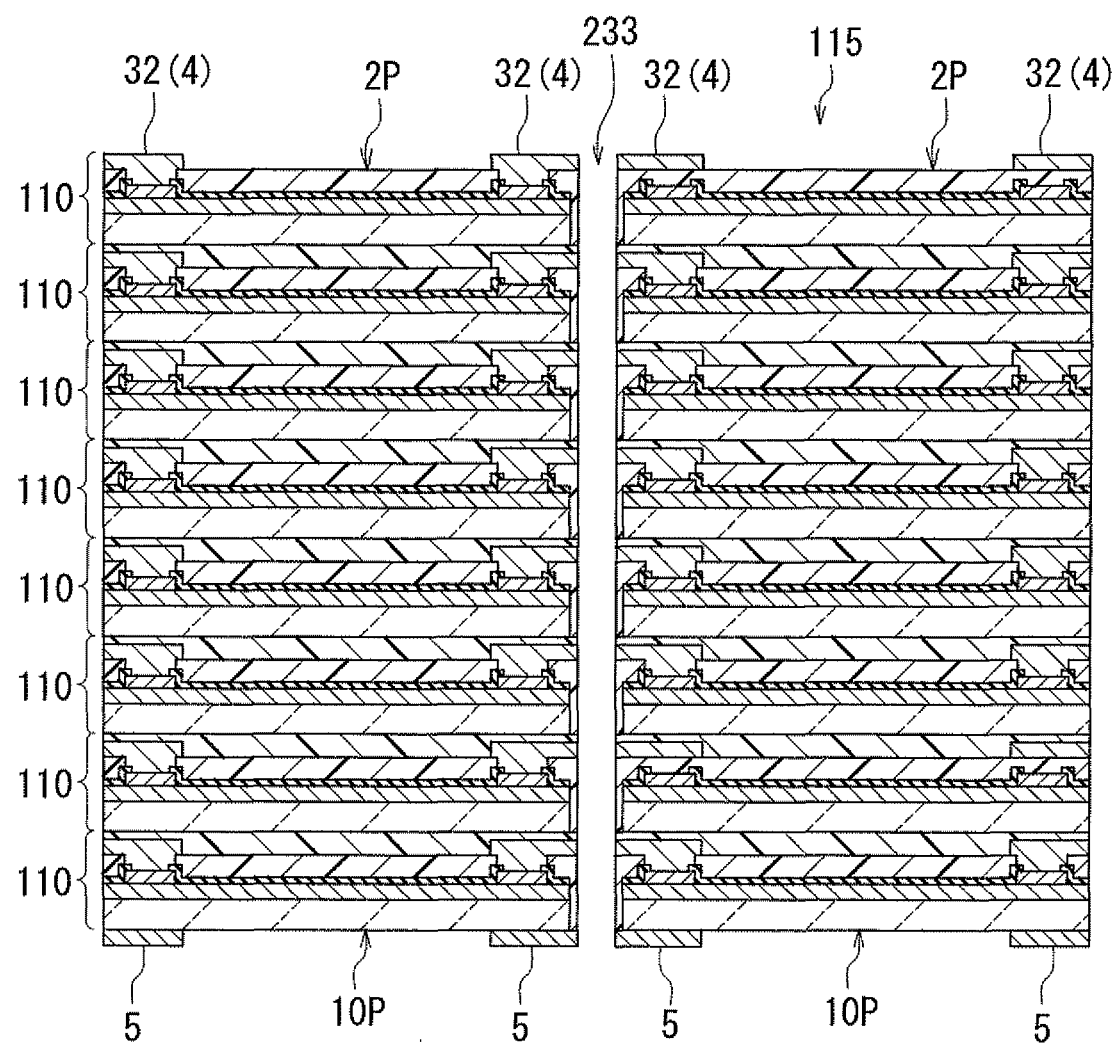
FIG. 49 is a cross-sectional view showing a step that follows the step shown in FIG. 47.
Figure 50:
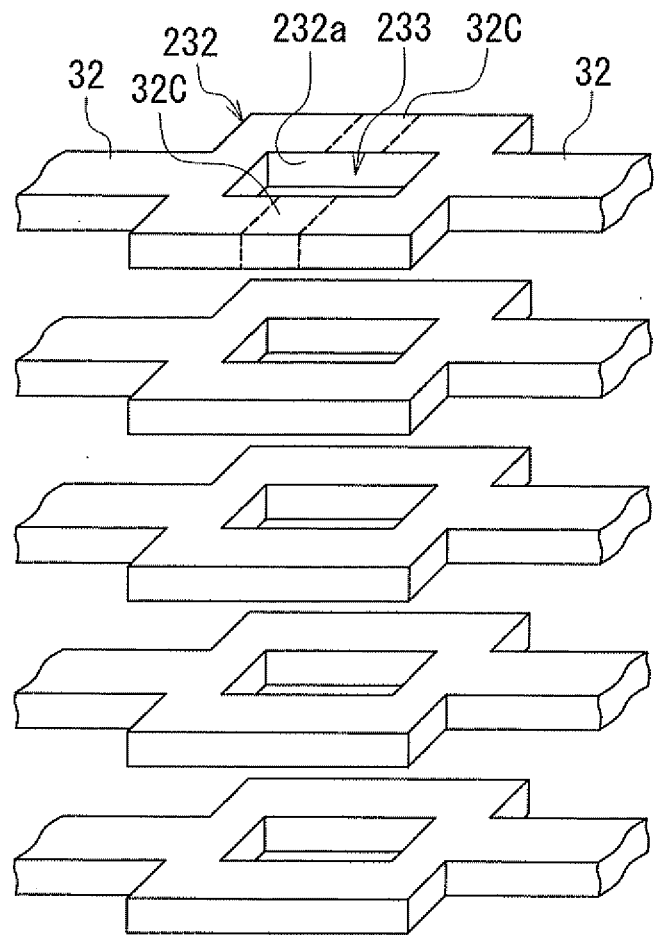
FIG. 50 is a perspective view showing a plurality of electrodes after the step shown in FIG. 49.

FIG. 49 is a cross-sectional view showing a step that follows the step shown in FIG. 47. FIG. 50 is a perspective view showing the plurality of electrodes 32 after the step shown in FIG. 49. In this step, a plurality of holes 233 for accommodating a plurality of preliminary wires to be described later are formed in the layered substructure 215 at the positions between two adjacent pre-separation main bodies 2P. In FIG. 50, the boundary positions between the electrodes 32 and the connecting portions 32C are shown by broken lines. The plurality of holes 233 are formed in the insulating layers 106A or 106B in a plurality of substructures 110. The holes 233 can be formed by, for example, laser processing or reactive ion etching. If the insulating layers 106A or 106B are formed of resin, the holes 233 can be formed easily in a short time by laser processing or reactive ion etching. Each single hole 133 is formed to pierce through the layered substructure 215, passing through the opening 235a of the conductor layer 235 and the openings 232a of a plurality of conductor layers 232 that are arranged in the direction in which the plurality of substructures 110 are stacked. The electrodes 32 and the terminals 5 are exposed in the wall faces of the hole 233.

Figure 51:
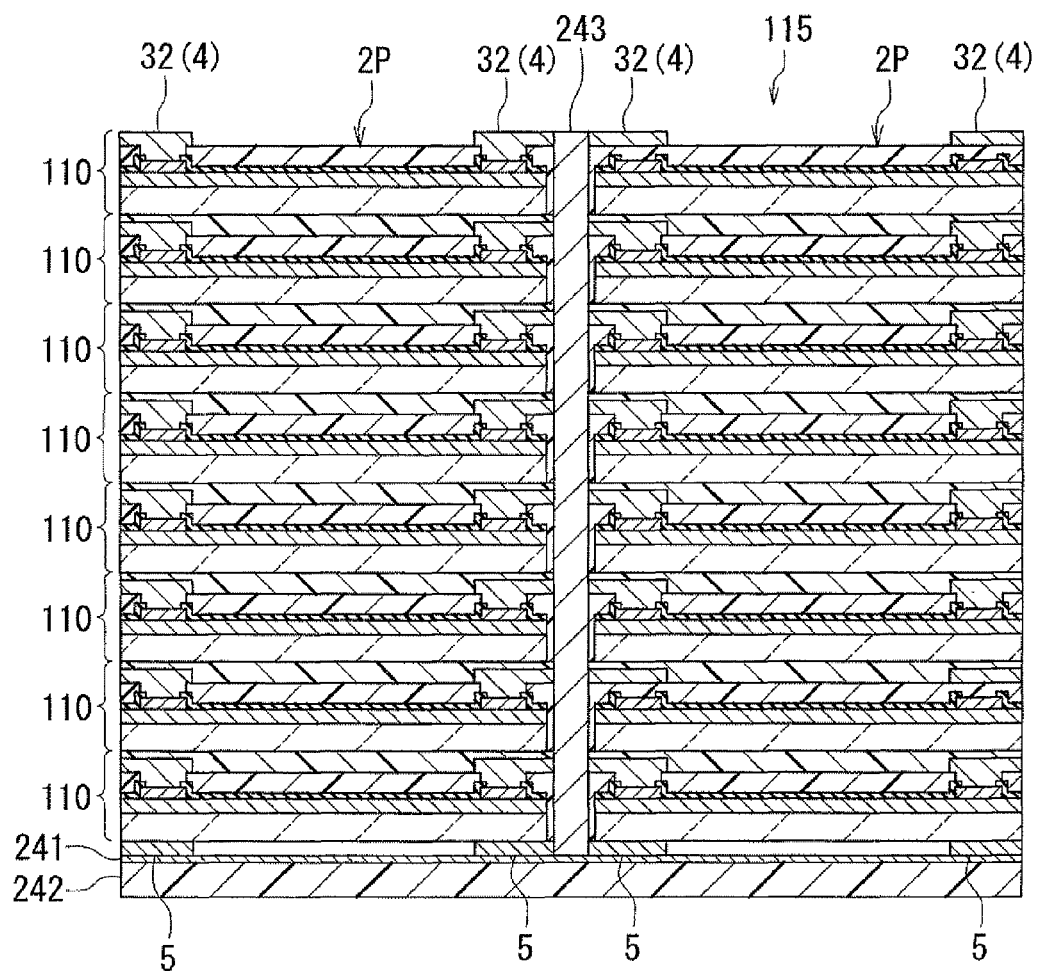
FIG. 51 is a cross-sectional view showing a step that follows the step shown in FIG. 49.

FIG. 51 is a cross-sectional view showing a step that follows the step shown in FIG. 49. In this step, a seed layer 241 for plating is bonded to the bottom surface of the lowermost substructure 110 of the layered substructure 215 having the plurality of holes 233 therein. The seed layer 241 is formed of a metal such as copper. The seed layer 241 may be a metal film supported by a plate 242 of resin or the like. Alternatively, the seed layer 241 may be a metal plate. In such a case, there is no need for the plate 242 for supporting the seed layer 241.

Next, preliminary wires 243 that are respectively made of plating films are formed in the plurality of holes 233 of the layered substructure 215 by electroplating. Here, the seed layer 241 is energized so that the plating films grow from the surface of the seed layer 241 to fill the holes 233. Each single preliminary wire 243 is in contact with the plurality of electrodes 32 and terminals 5 that are arranged in the direction in which the plurality of substructures 110 are stacked. In this step, prior to forming the plating films in the holes 233 by electroplating, seed layers each made of a metal film may be formed on the wall faces of the holes 233 by electroless plating. Subsequently, the plating films may be formed in the holes 233 by electroplating. When forming the plating films, the seed layers are energized so that the plating films grow from the surfaces of the seed layers to fill the holes 233. In such a modification example, the seed layers and the plating films constitute the preliminary wires 243. Instead of such a modification example, the preliminary wires 243 may be formed by electroless plating only.

Figure 52:
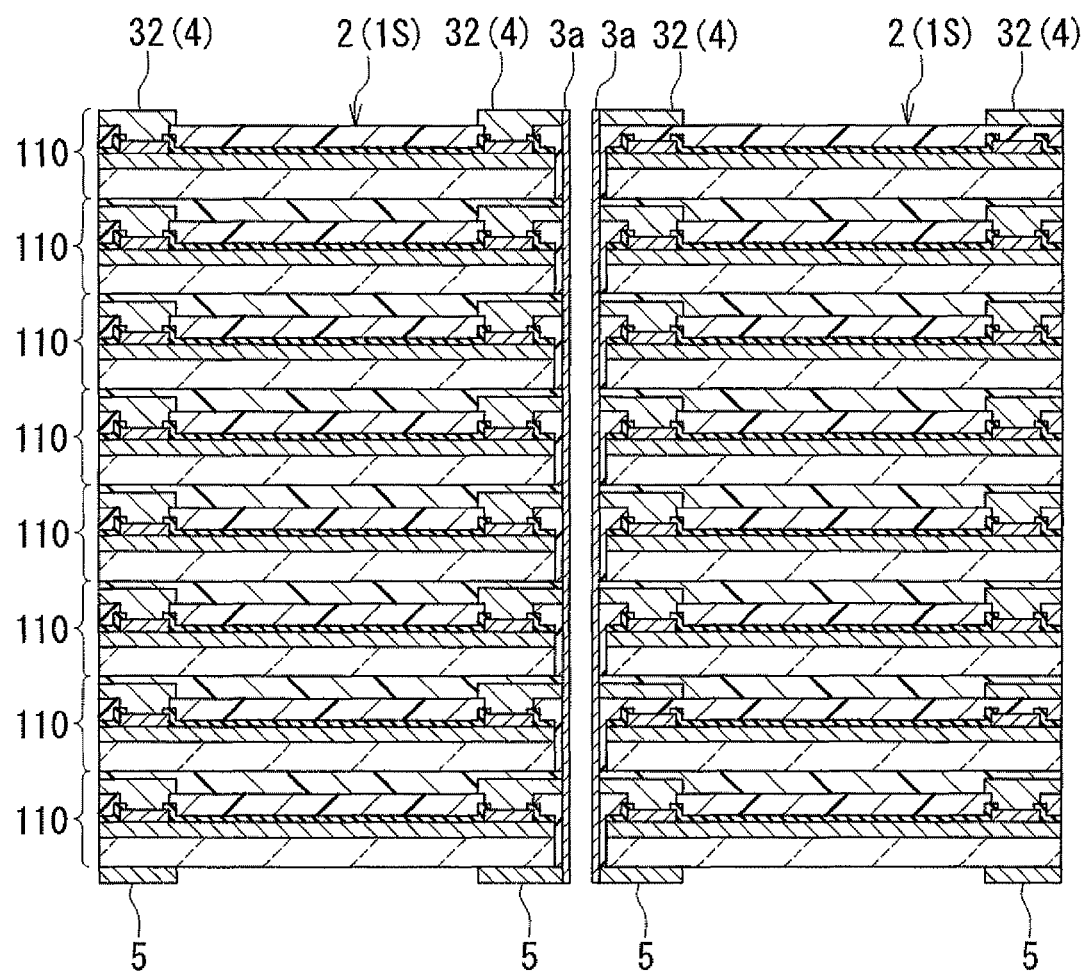
FIG. 52 is a cross-sectional view showing a step that follows the step shown in FIG. 51.

FIG. 52 shows a step that follows the step shown in FIG. 51. In this step, the layered substructure 215 is cut so that the plurality of pre-separation main bodies 2P are separated from each other and the plurality of preliminary wires 243 are split into two sets of a plurality of wires 3a of two separate main bodies 2, whereby a plurality of layered chip packages (subpackages 1S) are formed. When separated from each other, the plurality of pre-separation main bodies 2P become individual main bodies 2. In this step, the respective plurality of electrodes 32 of two pre-separation main bodies 2P connected to each other are separated from each other into the respective plurality of electrodes 32 of two separate main bodies 2 when the layered substructure 215 is cut. Similarly, the respective plurality of terminals 5 of two pre-separation main bodies 2P connected to each other are separated from each other into the respective plurality of terminals 5 of two separate main bodies 2 when the layered substructure 215 is cut. The wires 3a are electrically connected to the plurality of electrodes 32 (including the electrodes 32 that form the terminals 4) and terminals 5 that are arranged in the direction of stacking of a plurality of layer portions 10 in each main body 2.

According to the present embodiment, the preliminary wires 243 are formed in the plurality of holes 233 of the layered substructure 215 before the layered substructure 215 is cut. This allows manufacturing, through a small number of steps, a plurality of layered chip packages (subpackages 1S) each having a plurality of wires 3a disposed on at least one of the side surfaces of the main body 2. According to the present embodiment, it is thus possible to mass-produce the layered chip packages at low cost in a short time.

If the respective plurality of electrodes 32 of two adjacent pre-semiconductor-chip portions 30P are connected to each other in each of a plurality of substructures 110 that constitute the layered substructure 215, the present embodiment further provides the following advantageous effect. That is, in such a case, the electrodes 32 and the wire 3a have large contact areas therebetween after the cutting of the layered substructure 215. This can improve the reliability of the electrical connection between the electrodes 32 and the wire 3a.

The remainder of configuration, function and effects of the present embodiment are similar to those of the first embodiment.

The present invention is not limited to the foregoing embodiments, and various modifications may be made thereto. For example, in the first embodiment, a plurality of blocks 121 are arranged to form a block assembly 130, and further, a plurality of block assemblies 130 are arranged so that the wiring 3 is formed simultaneously on all of the pre-separation main bodies 2P that are included in the plurality of block assemblies 130. However, the wiring 3 may be simultaneously formed on all of the pre-separation main bodies 2P that are included in a single block assembly 130, or all of the pre-separation main bodies 2P that are included in a single block 121. After the plurality of pre-separation main bodies 2P each provided with the wiring 3 are separated from each other into a plurality of main bodies 2, additional wiring may be formed on the main bodies 2.

In the second embodiment, the respective plurality of electrodes 32 of two adjacent pre-semiconductor-chip portions 30P need not necessarily be connected to each other in each of the plurality of substructures 110 constituting the layered substructure 215.

In the second embodiment, the method of forming the preliminary wires 243 is not limited to plating, and may use other techniques. For example, the preliminary wires 243 may be formed by initially filling the holes 233 with a conductive paste that contains silver, copper or other metal powder and a binder, and then heating the conductive paste to decompose the binder and sinter the metal. Alternatively, the preliminary wires 243 may be formed by pressing silver, copper or other metal powder into the holes 233 and then heating the metal powder to sinter the metal.

It is apparent that the present invention can be carried out in various forms and modifications in the light of the foregoing descriptions. Accordingly, within the scope of the following claims and equivalents thereof, the present invention can be carried out in forms other than the foregoing most preferred embodiments.

What is claimed is:

1. A layered chip package comprising:
a main body having a top surface, a bottom surface, and four side surfaces; and
wiring disposed on at least one of the side surfaces of the main body, wherein:
the main body includes: a main part that includes a plurality of layer portions stacked and has a top surface and a bottom surface; and a plurality of first terminals that are disposed on the top surface of the main part and electrically connected to the wiring;
the plurality of layer portions include at least one first-type layer portion and at least one second-type layer portion;
each of the first-type and second-type layer portions includes a semiconductor chip;
the first-type layer portion further includes a plurality of first-type electrodes that are electrically connected to the semiconductor chip and to the wiring;
the second-type layer portion further includes a plurality of second-type electrodes that are electrically connected to the wiring and not to the semiconductor chip; and
the plurality of first terminals are formed by using the plurality of first-type or second-type electrodes of the uppermost one of the layer portions.

2. The layered chip package according to claim 1, wherein the semiconductor chip of the first-type layer portion is a normally functioning one, whereas the semiconductor chip of the second-type layer portion is a malfunctioning one.

3. The layered chip package according to claim 1, wherein:
the semiconductor chip has a plurality of electrode pads;
the first-type layer portion further includes a first-type insulating layer disposed around the plurality of electrode pads, the first-type insulating layer having a plurality of openings for exposing the plurality of electrode pads, the plurality of first-type electrodes being electrically connected to the plurality of electrode pads through the plurality of openings; and
the second-type layer portion further includes a second-type insulating layer that covers the plurality of electrode pads so as to avoid exposure.

4. The layered chip package according to claim 1, wherein the main body further includes a plurality of second terminals that are disposed on the bottom surface of the main part and electrically connected to the wiring.

5. The layered chip package according to claim 4, wherein at least either the first terminals or the second terminals each include a solder layer made of a solder material, the solder layer being exposed in a surface of each of the first terminals or each of the second terminals.

6. The layered chip package according to claim 1, wherein:
the semiconductor chip has four side surfaces;
each of the first-type and second-type layer portions further includes an insulating portion that covers at least one of the four side surfaces of the semiconductor chip; and the insulating portion has at least one end face that is located in the at least one of the side surfaces of the main body on which the wiring is disposed.

7. A method of manufacturing a plurality of layered chip packages of claim 1, comprising the steps of:
   fabricating a layered substructure by stacking a plurality of substructures each of which includes an array of a plurality of preliminary layer portions, each of the preliminary layer portions being intended to become any one of the layer portions included in the main part, the substructures being intended to be cut later at positions of boundaries between every adjacent ones of the preliminary layer portions; and
   forming the plurality of layered chip packages from the layered substructure.

8. The method of manufacturing the layered chip packages according to claim 7, wherein the semiconductor chip of the first-type layer portion is a normally functioning one, whereas the semiconductor chip of the second-type layer portion is a malfunctioning one.

9. The method of manufacturing the layered chip packages according to claim 8, wherein:
   the semiconductor chip has a plurality of electrode pads;
   the first-type layer portion further includes a first-type insulating layer disposed around the plurality of electrode pads, the first-type insulating layer having a plurality of openings for exposing the plurality of electrode pads, the plurality of first-type electrodes being electrically connected to the plurality of electrode pads through the plurality of openings;
   the second-type layer portion further includes a second-type insulating layer that covers the plurality of electrode pads so as to avoid exposure; and
   the step of fabricating the layered substructure includes, as a series of steps for forming each of the substructures, the steps of:
      fabricating a pre-substructure wafer that includes an array of a plurality of pre-semiconductor-chip portions, the pre-semiconductor-chip portions being intended to become the semiconductor chips, respectively;
      distinguishing the plurality of pre-semiconductor-chip portions included in the pre-substructure wafer into normally functioning pre-semiconductor-chip portions and malfunctioning pre-semiconductor-chip portions; and
      forming the first-type insulating layer and the first-type electrodes in the normally functioning pre-semiconductor-chip portions while forming the second-type insulating layer and the second-type electrodes in the malfunctioning pre-semiconductor-chip portions, so that the pre-substructure wafer is made into the substructure.

10. A composite layered chip package comprising a plurality of subpackages stacked, every vertically adjacent two of the subpackages being electrically connected to each other, wherein:
   each of the plurality of subpackages includes: a main body having a top surface, a bottom surface and four side surfaces; and wiring disposed on at least one of the side surfaces of the main body;
   the main body includes: a main part that includes at least one first-type layer portion and has a top surface and a bottom surface; and a plurality of first terminals that are disposed on the top surface of the main part and electrically connected to the wiring;
   in at least one of the plurality of subpackages, the main part further includes at least one second-type layer portion;
   each of the first-type and second-type layer portions includes a semiconductor chip;
   the first-type layer portion further includes a plurality of first-type electrodes that are electrically connected to the semiconductor chip and to the wiring;
   the second-type layer portion further includes a plurality of second-type electrodes that are electrically connected to the wiring and not to the semiconductor chip;
   the plurality of first terminals are formed by using the plurality of first-type or second-type electrodes of the uppermost one of the layer portions in each of the subpackages; and
   for any vertically adjacent two of the subpackages, the main body of the upper one of the two subpackages further includes a plurality of second terminals that are disposed on the bottom surface of the main part and electrically connected to the wiring, and the plurality of second terminals of the upper one of the subpackages are electrically connected to the plurality of first terminals of the lower one of the subpackages.

11. The composite layered chip package according to claim 10, wherein the semiconductor chip of the first-type layer portion is a normally functioning one, whereas the semiconductor chip of the second-type layer portion is a malfunctioning one.

12. The composite layered chip package according to claim 10, wherein:
   the semiconductor chip has a plurality of electrode pads;
   the first-type layer portion further includes a first-type insulating layer disposed around the plurality of electrode pads, the first-type insulating layer having a plurality of openings for exposing the plurality of electrode pads, the plurality of first-type electrodes being electrically connected to the plurality of electrode pads through the plurality of openings; and
   the second-type layer portion further includes a second-type insulating layer that covers the plurality of electrode pads so as to avoid exposure.

13. The composite layered chip package according to claim 10, wherein, for any vertically adjacent two of the subpackages, at least either the second terminals of the upper one of the subpackages or the first terminals of the lower one of the subpackages each include a solder layer made of a solder material, the solder layer being exposed in a surface of each of the first terminals or each of the second terminals.

14. The composite layered chip package according to claim 10, wherein:
   the semiconductor chip has four side surfaces;
   each of the first-type and second-type layer portions further includes an insulating portion that covers at least one of the four side surfaces of the semiconductor chip; and
   the insulating portion has at least one end face that is located in the at least one of the side surfaces of the main body on which the wiring is disposed.

15. A method of manufacturing the composite layered chip package of claim 10, comprising the steps of:
   fabricating the plurality of subpackages; and
   stacking the plurality of subpackages and, for any vertically adjacent two of the subpackages, electrically connecting the plurality of second terminals of the upper one of the subpackages to the plurality of first terminals of the lower one of the subpackages.

16. The method of manufacturing the composite layered chip package according to claim 15, wherein:
   for any vertically adjacent two of the subpackages, at least either the second terminals of the upper one of the subpackages or the first terminals of the lower one of the subpackages each include a solder layer made of a solder material, the solder layer being exposed in a surface of each of the first terminals or each of the second terminals; and in the step of electrically connecting the plurality of second terminals of the upper one of the subpackages to the plurality of first terminals of the lower one of the subpackages, the solder layer is heated to melt and then solidified to electrically connect the plurality of second terminals to the plurality of first terminals.

* * * * *